United States Patent
Shi

(10) Patent No.: US 12,205,828 B2
(45) Date of Patent: Jan. 21, 2025

(54) PACKAGING STRUCTURE AND FABRICATION METHOD THEREOF

(71) Applicants: NANTONG TONGFU MICROELECTRONICS CO., LTD, Nantong (CN); TONGFU MICROELECTRONICS CO., LTD., Nantong (CN)

(72) Inventor: Lei Shi, Nantong (CN)

(73) Assignees: NANTONG TONGFU MICROELECTRONICS CO., LTD, Nantong (CN); TONGFU MICROELECTRONICS CO., LTD., Nantong (CN)

( * ) Notice: Subject to any disclaimer, the term of this patent is extended or adjusted under 35 U.S.C. 154(b) by 403 days.

(21) Appl. No.: 17/629,507

(22) PCT Filed: Jul. 17, 2020

(86) PCT No.: PCT/CN2020/102757
§ 371 (c)(1),
(2) Date: Jan. 24, 2022

(87) PCT Pub. No.: WO2021/017895
PCT Pub. Date: Feb. 4, 2021

(65) Prior Publication Data
US 2022/0246446 A1 Aug. 4, 2022

(30) Foreign Application Priority Data

Jul. 26, 2019 (CN) .......................... 201910681482.4
Jul. 26, 2019 (CN) .......................... 201910681730.5
(Continued)

(51) Int. Cl.
*H01L 21/00* (2006.01)
*H01L 21/56* (2006.01)
(Continued)

(52) U.S. Cl.
CPC .......... *H01L 21/561* (2013.01); *H01L 21/568* (2013.01); *H01L 23/3121* (2013.01); *H01L 23/552* (2013.01)

(58) Field of Classification Search
CPC . H01L 21/561; H01L 21/568; H01L 23/3121; H01L 23/552
See application file for complete search history.

(56) References Cited

U.S. PATENT DOCUMENTS

2020/0027858 A1* 1/2020 Shi .......................... H01L 24/96
2022/0246540 A1* 8/2022 Shi ...................... H01L 21/6835
2022/0270982 A1* 8/2022 Miao ..................... H01L 21/561

FOREIGN PATENT DOCUMENTS

CN 205542768 U 8/2016
CN 107452696 A 12/2017
(Continued)

OTHER PUBLICATIONS

World Intellectual Property Organization (WIPO) International Search Report for PCT/CN2020/102757 Oct. 28, 2020 4 Pages.

*Primary Examiner* — Richard A Booth
(74) *Attorney, Agent, or Firm* — Anova Law Group, PLLC

(57) ABSTRACT

A packaging structure and fabrication method thereof are provided. The method includes: providing semiconductor chips including functional surfaces, non-functional surfaces, and first soldering pads; providing electronic devices that do not need shielding including second soldering pads; providing a carrier plate; adhering functional surfaces of the semiconductor chips to the carrier plate; forming a first shielding layer covering non-functional surfaces and sidewalls of the semiconductor chips; adhering each electronic device to the carrier plate at a side of a corresponding semiconductor chip; forming a second shielding layer on the first shielding layer; forming a plastic encapsulation layer
(Continued)

covering the second shielding layer, the electronic devices that do not need shielding, and the carrier plate; peeling off the carrier plate to form a pre-packaging plate; and forming first external contact structures connected to the first soldering pads and second external contact structures connected to the second soldering pads.

17 Claims, 8 Drawing Sheets

(30) Foreign Application Priority Data

Jul. 26, 2019 (CN) .......................... 201910681742.8
Jul. 26, 2019 (CN) .......................... 201910681799.8

(51) Int. Cl.
*H01L 23/31* (2006.01)
*H01L 23/552* (2006.01)

(56) References Cited

FOREIGN PATENT DOCUMENTS

| | | |
|---|---|---|
| CN | 107535078 A | 1/2018 |
| CN | 109841597 A | 6/2019 |
| CN | 110021701 A | 7/2019 |
| CN | 110707071 A | 1/2020 |
| CN | 110718472 A | 1/2020 |
| CN | 110718536 A | 1/2020 |
| CN | 110783208 A | 2/2020 |

* cited by examiner

PACKAGING STRUCTURE AND FABRICATION METHOD THEREOF

CROSS-REFERENCE TO RELATED APPLICATIONS

This application is a national phase entry under 35 U.S.C § 371 of International Application No. PCT/CN2020/102757, filed on Jul. 17, 2020, which claims the priority of Chinese Patent Application No. 201910681799.8, filed on Jul. 26, 2019, Chinese Patent application No. 201910681482.4, filed on Jul. 26, 2019, Chinese Patent Application No. 201910681742.8, filed on Jul. 26, 2019, and Chinese Patent Application No. 201910681730.5, filed on Jul. 26, 2019, the entire contents of all of which are incorporated herein by reference in their entirety.

TECHNICAL FIELD

The present disclosure generally relates to the field of semiconductor technologies and, more particularly, relates to a packaging structure with electromagnetic shielding and its fabrication method.

BACKGROUND

With the rapid development of a new generation of electronic products, integrated circuit packaging technology has developed towards a direction of high density, high frequency, miniaturization, and high integration level. Strong electromagnetic waves may often be generated from high-frequency chips, which induces undesirable interference or noise on chips in or out the packaging structures. The density of electronic devices also increases and distances between transmission wires become closer. Correspondingly, electromagnetic interference issues from inside or outside of integrated circuit packages becomes more severe gradually. The quality and service life of the integrated circuits are also reduced.

In electronic devices and electronic products, electromagnetic interference (EMI) energy is transmitted through conductive coupling and radiative coupling. To meet requirements of electromagnetic compatibility, filter technologies are needed for the conductive coupling, that is, EMI filter devices are used for suppressing the electromagnetic interference. For the radiated coupling, shielding technologies are needed for suppressing electromagnetic interference. Because existing electromagnetic spectrum has become increasingly dense, electromagnetic power density in a unit volume has dramatically increased, and a large number of high-level and low-level devices or equipment are used in a mixed manner. Correspondingly, electromagnetic environments of devices and systems deteriorate gradually. The importance of electromagnetic shielding becomes more prominent.

An existing electromagnetic shielding solution includes providing a magnetic field shielding layer on a semiconductor packaging structure to shield the electromagnetic interference between chips. There is a need to provide a packaging structure with improved electromagnetic shielding performance.

SUMMARY

One aspect of the present disclosure provides a fabrication method for forming a packaging structure. The method includes: providing semiconductor chips, where each semiconductor chip includes a functional surface, a non-functional surface opposite to the functional surface, first soldering pads on the functional surface; providing electronic devices that do not need shielding, and second soldering pads on surfaces of the electronic devices that do not need shielding; providing a carrier plate; adhering functional surfaces of the semiconductor chips to the carrier plate; forming a first shielding layer covering non-functional surfaces and sidewalls of the semiconductor chips; adhering each electronic device that does not need shielding to the carrier plate at a side of a corresponding semiconductor chip, where a surface of the electronic device that does not need shielding with the second soldering pads faces the adhesive surface of the carrier plate; forming a second shielding layer on the first shielding layer; forming a plastic encapsulation layer covering the second shielding layer, the electronic devices that do not need shielding, and the carrier plate; peeling off the carrier plate to form a pre-packaging plate, where a back surface of the pre-packaging plate exposes the first soldering pads on the functional surfaces of the semiconductor chips and the second soldering pads on the electronic devices that do not need shielding; and forming first external contact structures connected to the first soldering pads and second external contact structures connected to the second soldering pads, on the back surface of the pre-packaging plate.

Another aspect of the present disclosure provides a packaging structure. The packaging structure includes: a pre-packaging plate; a plastic encapsulation layer on the pre-packaging plate; semiconductor chips and electronic devices that do not need shielding, embedded in the plastic encapsulation layer, where each semiconductor chip includes a functional surface and a non-functional surface opposite to the functional surface; first soldering pads on functional surfaces of the semiconductor chips and second soldering pads on surfaces of the electronic devices that do not need shielding, where the plastic encapsulation layer exposes the first soldering pads and the second soldering pads; a first shielding layer and a second shielding layer between the semiconductor chips and the plastic encapsulation layers; first external contact structures connected to the first soldering pads on a back surface of the pre-packaging plate; and second external contact structures connected to the second soldering pads on the back surface of the pre-packaging plat. Each electronic device that does not need shielding is located at a side of a corresponding semiconductor chip. The first shielding layer covers the non-functional surfaces and the sidewalls of the semiconductor chips. The second shielding layer is located between the first shielding layer and the plastic encapsulation layer, and completely covers a portion of the first shielding layer on the non-functional surfaces and the sidewalls of the semiconductor chips.

Another aspect of the present disclosure provides a discrete packaging structure formed by cutting a packaging structure. The discrete packaging structure includes: a plastic encapsulation layer; a semiconductor chip and an electronic device that does not need shielding in the plastic encapsulation layer, where the semiconductor chip includes a functional surface and a non-functional surface opposite to the functional surface, and the electronic device that does not need shielding is located at a side of the semiconductor chip; first soldering pads on the functional surface of the semiconductor chip and second soldering pads on a surface of the electronic device that does not need shielding, where the plastic encapsulation layer exposes the first soldering pads and the second soldering pads; a first shielding layer and a second shielding layer between the semiconductor chips and the plastic encapsulation layer; first external contact structures connected to the first soldering pads on a back surface of the plastic encapsulation layer; and second external contact structures connected to the second soldering pads on the back surface of the plastic encapsulation layer. The first shielding layer covers the non-functional surfaces and the sidewall of the semiconductor chip. The second shielding layer is located between the first shielding layer and the plastic encapsulation layer, and completely covers a surface of a portion of the first shielding layer on the non-functional surface and the sidewalls of the semiconductor chip.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 33-39 illustrate structures corresponding to certain stages in another exemplary fabrication method for forming a packaging structure according to various disclosed embodiments of the present disclosure.

DETAILED DESCRIPTION

Figure 1:
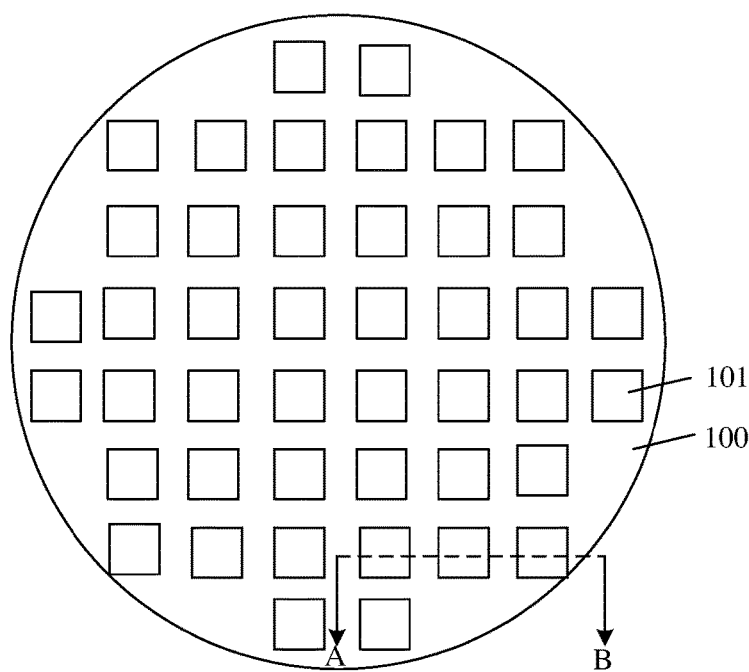
FIGS. 1-13 illustrate structures corresponding to certain stages in an exemplary fabrication method for forming a packaging structure according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts. For description purposes only, the embodiments below are used as examples to illustrate the present disclosure, and should not limit the scopes of the present disclosure.

In the description of the present application, it should be understood that the terms "first" and "second" are used for description purposes only, and cannot be understood as indicating or implying relative importance or implicitly indicating the number of technical features indicated. Thus, the features defined as "first" and "second" may explicitly or implicitly include one or more of the features. In the description of this application, the meaning of "plurality" is two or more, unless otherwise specifically limited.

There are needs to improve electromagnetic shielding performance.

In the existing technologies, a magnetic field shielding layer is usually formed by a sputtering process. A semiconductor packaging structure usually has a large thickness and a rectangular shape. Correspondingly, the semiconductor packaging structure usually has multiple apex angles and steep sidewalls. When forming the magnetic field shielding layer to cover the semiconductor packaging structure by the sputtering process, a thickness of the formed magnetic field shielding layer may be inhomogeneous and edges of the semiconductor packaging structure may not be covered. It may be difficult to guarantee the shielding performance of the magnetic field shielding layer.

The present disclosure provides a packaging structure and its fabrication method to at least partially alleviate the above problems. The fabrication method may include: after adhering functional surfaces of semiconductor chips to a carrier plate, forming a first shielding layer to cover non-functional surfaces and sidewalls of the semiconductor chips; adhering electronic devices that do not need shielding on the carrier plate at sides of each semiconductor chip correspondingly such that surfaces of the electronic devices with second first soldering pads that do not need shielding may face an adhering surface of the carrier plate; forming a second shielding layer; forming a plastic encapsulation layer covering the second shielding layer, the electronic devices that do not need shielding, and the carrier plate; peeling off the carrier plate to form a pre-packaging plate, such that a backside of the pre-packaging plate may expose first soldering pads on the semiconductor chips and the second first soldering pads on the electronic devices that do not need shielding; and forming first external contact structures connected to the first soldering pads and second external contact structures connected to the second first soldering pads. By forming the second shielding layer on the first shielding layer, the second shielding layer may cover a portion of the first shielding layer with uneven thickness and poor edge coverage, thereby making an overall shield layer formed by the first shielding layer and the second shielding layer complete, to improve shielding performance.

One embodiment of the present disclosure provides a fabrication method for forming a packaging structure, as illustrated in FIGS. 1-13.

Figure 2:
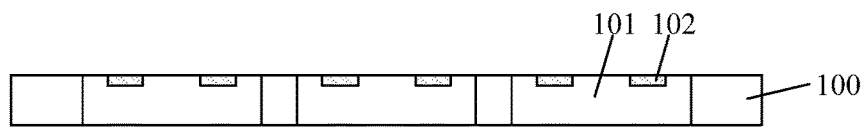
Figure 3:
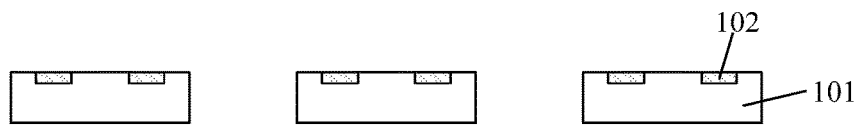

As illustrated in FIGS. 1-3 where FIG. 2 is a cross-section view along an AB direction in FIG. 1. Semiconductor chips 101 may be provided. Each semiconductor chip 101 may include a functional surface and a non-functional surface opposite to the functional surface. First soldering pads 102 may be disposed on the functional surface of each semiconductor chip 101.

In each semiconductor chip, integrated circuits (not shown in the figures) may be formed on the functional surface, and the first soldering pads 102 may be disposed on the functional surface. The first soldering pads 102 may be electrically connected to the integrated circuits in the semiconductor chip 101 and may be used as terminals for electrically connecting the integrated circuits in the semiconductor chip 101 to external circuits.

In each semiconductor chip 101, the functional surface may be a surface for forming the integrated circuits and the non-functional surface may be a surface opposite to the functional surface, while surrounding surfaces between the functional surface and the non-functional surface may be sidewalls of the semiconductor chip 101.

The semiconductor chips 101 may be formed by a semiconductor integration manufacturing process. As illustrated in FIGS. 1-2, a wafer 100 may be provided. The wafer 100 may include chip areas arranged in rows and columns, and cutting path areas between the chip areas. The semiconductor chips 101 may be formed correspondingly in the chip areas of the wafer 100. The first soldering pads 102 may be formed on the functional surface of each of the semiconductor chips 101 As illustrated in FIG. 3, after forming the first soldering pads 102, the wafer 100 may be cut along the cutting path to form the discrete semiconductor chips 101.

In one embodiment, the wafer 100 may be made of a material including single-crystalline silicon, single-crystalline germanium, GeSi, SiC, silicon on an insulator (SOI), germanium on an insulator (GOI), or other materials including III-V compounds such as GaAs.

In one embodiment, integrated circuits in the semiconductor chips 101 may include semiconductor devices (such as transistors, memories, or diodes) and/or interconnection structures connecting the semiconductor devices (such as metal wires or metal plugs).

In one embodiment, the semiconductor chips 101 may be semiconductor chips requiring electromagnetic shielding.

Figure 4:
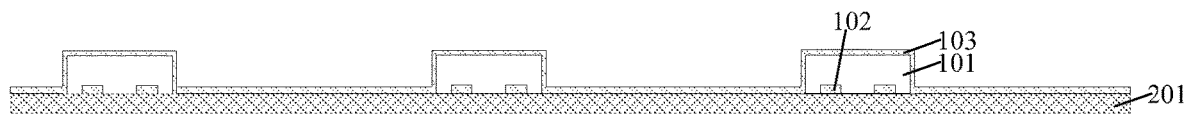

As illustrated in FIG. 4, a carrier plate 201 may be provided and the functional surfaces of the semiconductor chips 101 may be adhered to the carrier plate 210.

The carrier plate 201 may provide a support platform for subsequent processes. In one embodiment, the carrier plate 210 may be a glass carrier plate, a silicon carrier plate, or a metal carrier plate. In some other embodiments, the carrier plate 210 may be a carrier plate made of other suitable materials.

The semiconductor chips 101 may be adhered to the carrier plate 210 through an adhesive layer, and the functional surfaces of the semiconductor chips 101 (or the first soldering pads 102) may face an adhesive surface of the carrier plate 201.

The adhesive layer may be made of any suitable material. In one embodiment, the adhesive layer may be made of UV glue. The UV glue may be an adhesive material that can react to ultraviolet light with a special wavelength. The UV glue may include two types according to change in its viscosity after ultraviolet light irradiation. One type of the UV glue may be a UV curing glue. A photoinitiator or photosensitizer of a material of the UV curing glue may absorb the ultraviolet light under ultraviolet radiation to generate active radicals or cations. Correspondingly, monomer polymerization, cross-linking, or grafting chemical reactions may be initiated to make the UV curing glue change from liquid to solid in a few seconds, thereby bonding the UV curving glue with a surface of an object in contact with the UV curing glue. Another type of the UV glue may have a high viscosity when not exposed to the ultraviolet irradiation. After the ultraviolet irradiation, cross-linking chemical bonds in a material of the UV glue may be broken, resulting in a significant decrease or disappearance of the viscosity. In one embodiment, the UV glue in the adhesive layer may be the latter, and may be formed by a film sticking process, a glue printing process, or a rolling glue process.

In some other embodiments, the adhesive layer may be made of a material including epoxy glue, polyimide glue, polyethylene glue, benzocyclobutene glue, or polybenzoxazole glue.

The semiconductor chips 201 may be adhered to the carrier plate 201 evenly in rows and columns.

Figure 5:
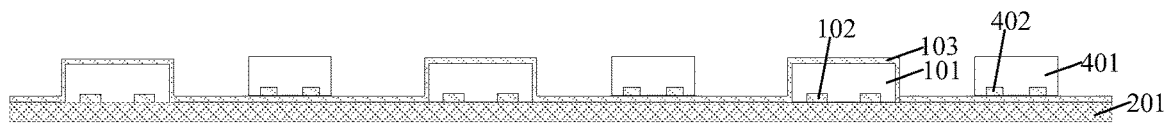

As illustrated in FIG. 5, in some embodiments, an insulating layer including a first insulating layer 121 and a second insulating layer 122 on the first insulating layer 121, and a rewiring layer 123 in the insulating layer, may be formed on the carrier plate 201. The insulating layer (the first insulating layer 121) may expose a surface of a portion of the rewiring layer 123. The semiconductor chips 201 may be adhered to the rewiring layer 123 on the carrier plate 201. In one embodiment, the first soldering pads 102 may be adhered to the rewiring layer 123 through a solder layer.

Figure 6:
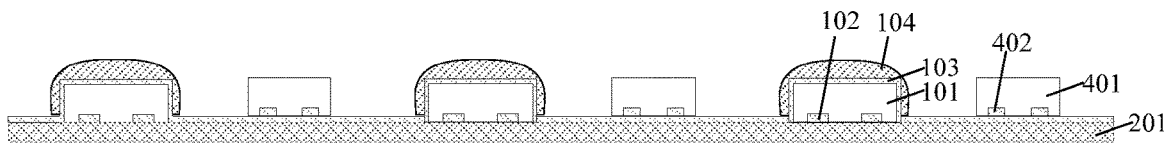

As illustrated in FIG. 6, a first shielding layer 103 may be formed to cover the non-functional surfaces and the sidewalls of the semiconductor chips 101.

In one embodiment, the first shielding layer 103 may cover the non-functional surfaces and the sidewalls of the semiconductor chips 101, and also cover surfaces of a portion of the carrier plate 201 between the semiconductor chips 101. In some other embodiments, the first shielding layer 103 may only cover the non-functional surfaces and the sidewalls of the semiconductor chips 101.

In one embodiment, the first shielding layer may be formed by a sputtering process, and may be made of a material including copper, tungsten, or aluminum. Since each of the semiconductor chips 101 may have four apex angles (at right angles), a large thickness, and steep sidewalls (angles between the sidewalls and the surface of the carrier plate 201 may be 90 degrees), the first shielding layer 103 formed by the sputtering process may have problems of uneven thickness and poor edge coverage.

In one embodiment, the formed first shielding layer 103 may be a shielding layer for electric field and magnetic field, and may be used for shielding the electric field and the magnetic field. The second shielding layer formed subsequently may also be a shielding layer for the electric field and the magnetic field, and may be used for shielding the electric field and the magnetic field.

A shielding layer may be needed to shielding the electric field and the magnetic field. An existing single-layer shielding layer with a specific material or an existing shielding layer including multilayer same or similar materials may only have a good shielding effect for the electric field, and have a weak shielding effect for the magnetic field. The shielding performance may be poor. In some other embodiments, the first shielding layer 103 may be a shielding layer for the magnetic field, and may be used for shielding the magnetic field. The second shielding layer formed subsequently may be a shielding layer for the electric field, and may be used for shielding the electric field. In some other embodiments, the first shielding layer 103 may be a shielding layer for the electric field, and may be used for shielding the electric field. The second shielding layer formed subsequently may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the first shielding layer 103 is the electric field shielding layer, the first shield layer 103 (the electric field shielding layer) may be made of a material including copper, tungsten, or aluminum. When the first shielding layer 103 is a magnetic field shielding layer, the first shield layer 103 (the magnetic field shielding layer) may be made of a material including CoFeB alloy, CoFeTa, NiFe, Co, CoFe, CoPt, or Ni—Co—Fe alloy. The first shielding layer 103 may be formed by a sputtering process, a physical vapor deposition process, an atomic layer deposition process, a chemical vapor deposition process, or any other suitable processes.

As illustrated in FIG. 5, electronic devices 401 that do not need shielding may be provided. The electronic devices 401 that do not need shielding may include second soldering pads 402 on surfaces of the electronic devices 401. Each electronic devices 401 that do not need shielding may be adhered to the carrier plate 201 at a side of a corresponding semiconductor chip 101. A surface of the electronic devices 401 that do not need shielding with the second soldering pads 401 may face the adhesive surface of the carrier plate 201.

The electronic devices 401 that do not need shielding may be electronic devices that do not need electromagnetic shielding, and may include heterogeneous chips or passive elements. The heterogeneous chips may include chips with functions or types different from the semiconductor chips 101. The passive elements may include capacitors or inductors.

Each electronic device 401 that does not need shielding may be adhered to the carrier plate 201 at a side of a corresponding semiconductor chip 101. After cutting the pre-packaging plate subsequently, each semiconductor chip 101 and a corresponding electronic device 401 that does not need shielding may be packaged into a same discrete packaging structure.

In one embodiment, the electronic devices 401 that do not need shielding may be adhered to the carrier plate 201 after forming the first shielding layer 103. Specifically, each electronic device 401 that does not need shielding may be adhered to a portion of the first shielding layer 103 on the carrier plate 201 at a side of a corresponding semiconductor chip 101. The electronic devices 401 that do not need shielding may be adhered to the carrier plate through an adhesive layer.

In another embodiment, each electronic device 401 that does not need shielding may be adhered to the carrier plate 201 at a side of a corresponding semiconductor chip 101 before forming the first shielding layer. Subsequently, after forming the second shielding layer but before forming the plastic encapsulation layer, a portion of the first shielding layer on the electronic devices 401 that do not need shielding and on the carrier plate between the semiconductor chips may be removed by an etch process.

In another embodiment, after forming the second shielding layer and removing a portion of the first shielding layer on the carrier plate between the semiconductor chips, but before forming the plastic encapsulation layer, each electronic device 401 that does not need shielding may be adhered to the carrier plate 201 at a side of a corresponding semiconductor chip 101.

As illustrated in FIG. 6, a second shielding layer 104 may be formed on the first shielding layer 103.

By forming the second shielding layer 104 on the first shielding layer 103, the second shielding layer 104 may cover a portion of the first shielding layer 103 with the uneven thickness and poor edge coverage. Correspondingly, the overall shielding layer constituted by the first shielding layer 103 and the second shielding layer 104 may be complete, improving the shielding performance.

In one embodiment, the second shielding layer 104 may be only located on a portion of the surface of the first shielding layer 103 on the non-functional surfaces and the sidewalls of the semiconductor chips 101. A surface of the second shielding layer 104 may be ellipsoidal. The second shielding layer 104 may be formed by a selective plating process, a dispensing process or a mesh printing process, so that the formed second shielding layer 104 can better cover the first shielding layer and prevent the second shielding layer 104 from forming areas with poor coverage. Correspondingly, the integrity of the overall shield layer formed by both the first shield layer 103 and the second shield layer 104 may be further ensured, and the subsequent removal of the semiconductor chips may not need additional masking and etching processes.

In one embodiment, the second shielding layer 104 may be made of a material including copper, solder, or conductive silver paste. In one embodiment, the second shielding layer 104 may be formed by: forming a mask layer (not shown in the figures) on the carrier plate 201 where the mask layer includes openings exposing the portion of the first shielding layer 103 on the non-functional surfaces and the sidewalls of the semiconductor chips 101; forming the second shielding layer 104 in the openings by using the first shielding layer as a conductive layer in the plating process to electroplate, or brushing the solder into the openings to form the second shielding layer 104 directly; and removing the mask layer.

In another embodiment, the second shielding layer 104 may be made of solder or conductive silver paste, and may be formed by the dispensing process or the mesh printing process correspondingly. When performing the dispensing process, the solder or the conductive silver paste may be applied on a surface of the portion of the first shielding layer 103 on the non-functional surfaces and the sidewalls of the semiconductor chips 101. When performing the mesh printing process, a portion of the first shielding layer 103 on a portion of the carrier plate 201 around the semiconductor chips 101, and correspondingly a remaining portion of the first shielding layer 103 may cover the non-functional surfaces and the sidewalls of the semiconductor chips 101, and side surfaces of a underfill layer. The remaining portion of the first shielding layer 103 may further extend to partially cover the surface of the portion of the carrier plate 201 around the semiconductor chips 101. Then a mesh plate with meshes may be placed on the carrier plate 201 and each of the semiconductor chips may be placed in a correspondingly mesh in the mesh plate. Subsequently, the solder may be brushed into the meshes and the solder may cover the surface of the portion of the first shielding layer 103 on the non-functional surfaces and the sidewalls of the semiconductor chips 101. Then the mesh plate may be removed and the solder may be reflowed to form the second shielding layer 104.

In one embodiment, the solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the second shielding layer 104 is the electric field shielding layer, the second shielding layer 104 (the electric field shielding layer) may be made of a material including copper, tungsten, or aluminum. When the second shielding layer 104 is a magnetic field shielding layer, the second shielding layer 104 (the magnetic field shielding layer) may be made of a material including CoFeB alloy, CoFeTa, NiFe, Co, CoFe, CoPt, or Ni—Co—Fe alloy. The second shielding layer 104 may be formed by a sputtering process, a physical vapor deposition process, an atomic layer deposition process, a chemical vapor deposition process, or any other suitable processes.

In one embodiment, after forming the second shielding layer 104, a portion of the first shielding layer 103 on the portion of the carrier plate between the semiconductor chips 101 may be removed by etching.

Figure 7:
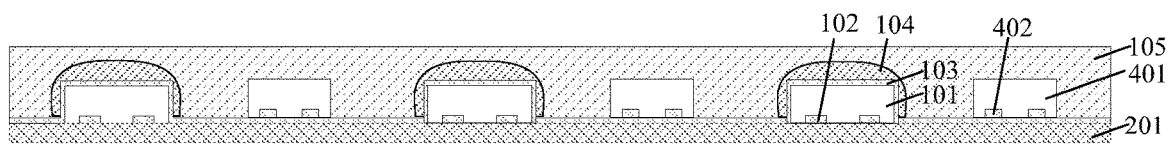

As illustrated in FIG. 7, a plastic encapsulation layer 105 may be to cover the second shielding layer 104, the electronic devices 401 that do not need shielding, and the carrier plate 201.

The plastic encapsulation layer 105 may encapsulate and fix the semiconductor chips 101 and the electronic devices 401 that do not need shielding, for forming a pre-packaging plate subsequently.

The plastic encapsulation layer 105 may be made of a material including epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol, or a combination thereof.

The plastic encapsulation layer 105 may be formed by an injection molding process, a transfer molding process, or any other suitable processes.

Figure 8:
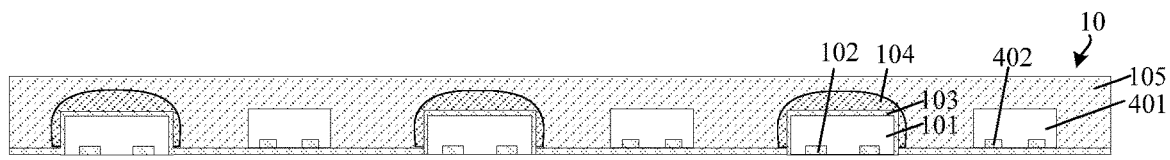
Figure 9:

As illustrated in FIGS. 8-9, the carrier plate 201 may be peeled off to form the pre-packaging plate 10, such that a back surface of the pre-packaging plate 10 may expose the first soldering pads 102 on the functional surfaces of the semiconductor chips 101 and the second soldering pads 402 of the electronic devices 401 that do not need shielding.

The adhesive layer may be removed by a process including chemical etching, mechanical peeling, CMP, mechanical grinding, or hot baking, to peel off the carrier plate 201.

In one embodiment, after peeling off the carrier plate 201, a portion of the first shielding layer 103 on a portion of the back surface of the pre-packaging plate 10 at a side of a corresponding semiconductor chip 101 may be removed simultaneously. When removing a portion of the first shielding layer 103 on a portion of the back surface of the pre-packaging plate 10 at a side of a corresponding semiconductor chip 101, another portion of the first shielding layer 103 on the surfaces of the second soldering pads 402 may be preserved or removed.

Figure 10:
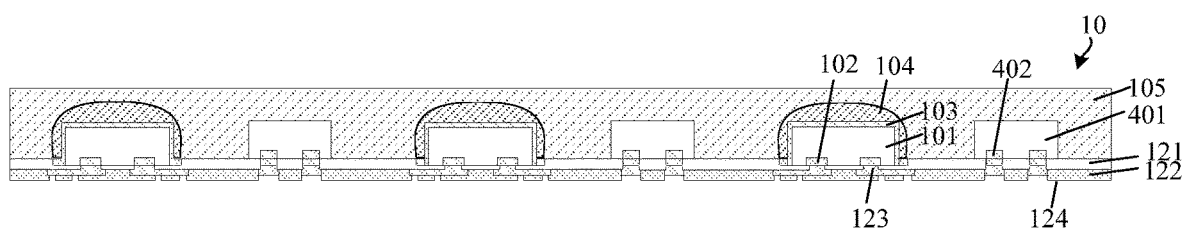
Figure 11:
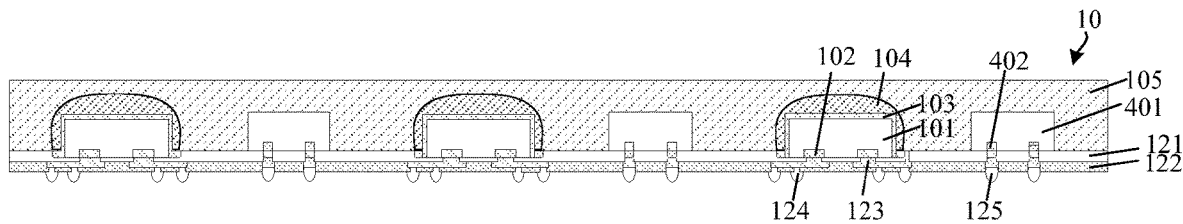

As illustrated in FIGS. 10-11, a first external contact structure connected to each first soldering pad 102 may be formed on the back surface of the pre-packaging plate 10.

In one embodiment, each first external contact structure may include a rewiring layer 123 connected to a first soldering pad 102 on the back surface of the pre-packaging plate 10 and external contact parts 124 on and connected to the rewiring layer 123. Each first soldering pad 102 of each semiconductor chip 101 may be connected to corresponding external contact parts 124.

In one embodiment, rewiring layers 123 and external contact parts 124 in external contact structures of the semiconductor chips 101 may be formed by: forming an insulating layer (a first insulating layer) 121 on the back surface of the pre-packaging plate 10 where the insulating layer (the first insulating layer) 121 includes openings exposing the first soldering pads 130; forming a rewiring layer 123 in each opening and on a surface of a portion of the insulating layer (the first insulating layer) 121; and forming the external contact parts 124 on a portion of each rewiring layer 123 outside a corresponding opening. The insulating layer (the first insulating layer) 121 may be made of a material including SiN, silicon-boron glass, silicon-phosphor glass, silicon-boron-phosphor glass, or a combination thereof. In one embodiment, each external contact part 123 may be a soldering ball or include a metal post and a soldering ball on the metal post. The external contact parts 123 may be formed by: forming a second insulating layer 122 on the first insulating layer 121 and on the rewiring layers 123, where the second insulating layer 122 may include third openings exposing a portion of a surface of each rewiring layer 123 on the surface of the first insulating layer 121; and forming the external contact parts 124 in the third openings.

The first insulating layer 121 and the second insulating layer 122 may further include second openings exposing the surfaces of the second soldering pads 402 or surfaces of a portion of the first shielding layer on the second soldering pads 402, and second external contact structures 125 may be formed in the second openings.

Each second external contact structure 125 may be a soldering ball or include a metal post and a soldering ball on the metal post.

In one embodiment, conductive contact structures (not shown in the figures) may be further formed on the first insulating layer 121 to electrically connect the first shielding layer 103 to a portion of the rewiring layers 123. Correspondingly, the first shielding layer may discharge through the portion of the rewiring layers 123 or block external static electrical interference.

In some embodiments, the method further including forming wires connecting a portion of the first soldering pads 102 of the semiconductor chips to a portion of the second soldering pads 402 of the electronic devices 402 that do not need shielding (not shown in the figures), such that the electrical signals can transmit between the semiconductor chips and the electronic devices 402 that do not need shielding. Correspondingly, the semiconductor chips and the electronic devices 402 that do not need shielding can process the signals from each other, and the performance of the packaging structure may be improved.

Figure 12:
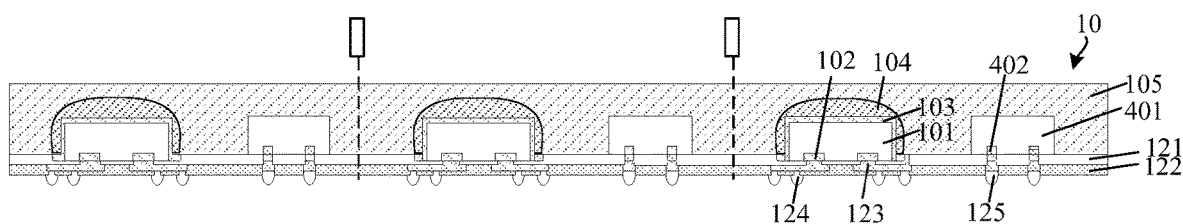
Figure 13:
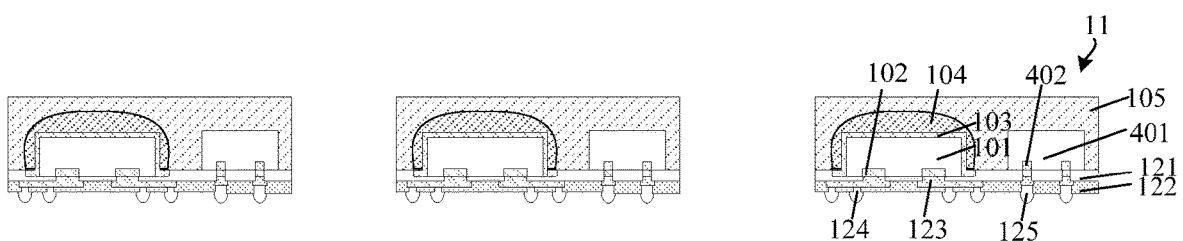

As illustrated in FIGS. 12-13, after forming the first and second external contact structures, the pre-packaging plate may be cut to form discrete packaging structures 11.

Each of the discrete packaging structures 11 may include the plastic encapsulation layer 105, and a semiconductor chip 101 in the plastic encapsulation layer 105, and an electronic device 401 that does not need shielding at a side of the semiconductor chip 101. The semiconductor chip 101 may include a functional surface and a non-functional surface opposite to the functional surface. First soldering pads 102 may be disposed on the functional surface of the semiconductor chip 101, and second soldering pads 402 may be formed on the electronic device 401 that does not need shielding. The plastic encapsulation layer 105 may expose the first soldering pads 102 and the second soldering pads 402. The discrete packaging structure 11 may further include a first shielding layer 103 and a second shielding layer 104 between the semiconductor chip 101 and the plastic encapsulation layer 105, and between the first plastic encapsulation layer 132 and the plastic encapsulation layer 105. The first shielding layer 132 may cover the non-functional surface and the sidewalls of the semiconductor chip 101. The second shielding layer 104 may be disposed between the first shielding layer 103 and the plastic encapsulation layer 105, and may completely cover a surface of a portion of the first shielding layer 103 on the non-functional surface and the sidewalls of the semiconductor chip 101.

The packaging structure 11 may further include first external contact structures connected to the first soldering pads 101 on the semiconductor chip 101 and second external contact structures connected to the second soldering pads 402 on the electronic device 401 that does not need shielding. The first and the second external contact structures are formed on the back surface of the plastic encapsulation layer 105.

In the present disclosure, massive production of the packaging structure 11 with the first shielding layer 103 and the second shielding layer 104 may be achieved by the above semiconductor integration fabrication process. Producing efficiency may be improved.

The present disclosure also provides another fabrication method for forming a packaging structure. FIGS. 14-19 illustrate semiconductor structures corresponding to different stages in the fabrication method for forming a packaging structure. In comparison to the previous fabrication method, in the present method, a bottom shielding layer may be formed on the functional surfaces of the semiconductor chips. The bottom shielding layer may completely cover the functional surfaces of the semiconductor chips, and have surrounding edges flush with surrounding sidewalls of the semiconductor chips. The first soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

Figure 14:
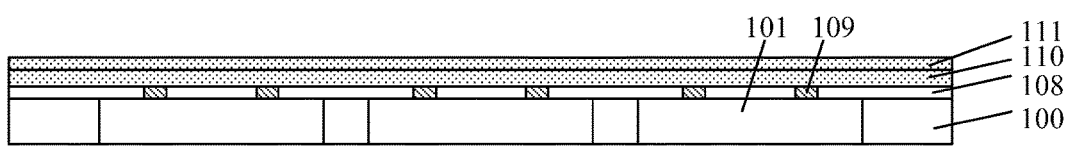
FIGS. 14-19 illustrate structures corresponding to certain stages in another exemplary fabrication method for forming a packaging structure according to various disclosed embodiments of the present disclosure.

The semiconductor chips with the bottom shielding layer may be formed by the following processes. As illustrated in FIG. 14, a wafer 100 and semiconductor chips 101 on the wafer 100 may be provided. Each semiconductor chip 101 of the semiconductor chips 101 may include a top dielectric layer 108 and a top interconnection structure 109 in the top dielectric layer 108. The semiconductor chip 101 may further include semiconductor devices (such as transistors) formed on a surface of the wafer 100 (or on a semiconductor substrate), interlayer dielectric layers between the top dielectric layer 108 and the surface of the wafer 100. Each of the interlayer dielectric layers may include a corresponding interconnection structure. Interconnection structures in the interlayer dielectric layers may connect upper or lower layers, or electrically connected to the semiconductor devices. The top interconnection structure 109 in the top dielectric layer 108 may be electrically connected to an interconnection structure in an adjacent interlayer dielectric layer of the interlayer dielectric layers.

Subsequently, an isolation layer may be formed on each top dielectric layer 108.

In one embodiment, each isolation layer may have a multilayer structure, and may include a first isolation layer 110 and a second isolation layer 111 on the first isolation layer 110. The first isolation 110 and the second isolation layer 111 may be made of different materials. The first isolation 110 and the second isolation layer 111 may be made of one of $SiO_2$, SiN, or SiNO respectively, to achieve precise control of depth of third openings formed subsequently. Correspondingly, when forming the third openings, an excessive etching of the isolation layer which may induce exposing of a portion of a surface of the top interconnection structure 109 on the top dielectric layer 108 by the third openings and short circuits between top interconnection structures 109 when forming the bottom shielding layer in the third openings, may be prevented.

In some other embodiments, each isolation layer may have a single-layer structure.

Figure 15:
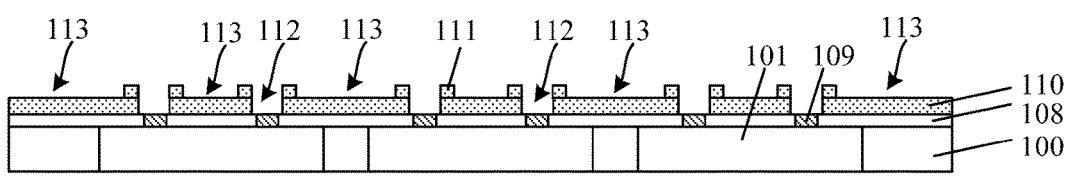

As illustrated in FIG. 15, the isolation layers may be etched to form first openings 112 and third openings 113 surrounding the first openings 112. A remaining portion of the isolation layers may be only located between the first openings 112 and the third openings 113, to separate the first openings 112 from the third openings 113.

The first openings 112 may be discrete and penetrate through the isolation layers 111. Each first opening 112 may expose a portion of a surface of a corresponding interconnection structure 109. The first openings 112 may be filled with metal to form the first soldering pads.

Each third opening 113 may surround a corresponding first opening 112, and may be separated from the corresponding first opening 112 through the isolation layers 111. Each third opening 113 may have a depth smaller than a thickness of the isolation layer. All areas outside the first openings 112 and outside the isolation layer 111 surrounding the first openings 112 may correspond to areas of the third openings 113. The third openings 113 may be connected. When forming the bottom shielding layer in the third openings 113, the bottom shielding layer may cover all areas of the functional surfaces of the semiconductor chips 101 except for the first soldering pads (formed in the first openings 112) and the isolation layer surrounding the first soldering pads. When forming the first shielding layer on the non-functional surfaces and the sidewalls of the semiconductor chips 101, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In one embodiment, the second isolation layers 111 may be etched using a first etch process with the first isolation layers 110 as a stop layer, to form the third openings in the second isolation layers 111. Subsequently, the second isolation layers 111 and the first isolation layers 110 may be etched using a second etch process, to form the first openings in the second isolation layers 111 and the first isolation layers 110. Before the first and the second etch processes, a corresponding mask layer may be formed on the second isolation layers. In some other embodiment, the second etch process may be performed before the first etch process.

In some other embodiments, each isolation layer may have a single-layer structure, and the first openings and the third openings may be formed by two etch processes respectively. Depth of the third openings may be controlled by controlling the etch time of the etch process (the depth of the third openings may be smaller than the thickness of the isolation layers).

Figure 16:
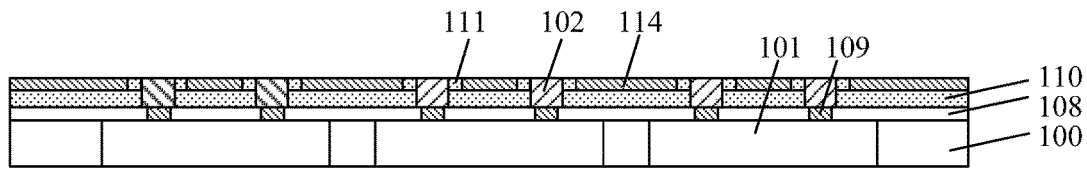
Figure 17:
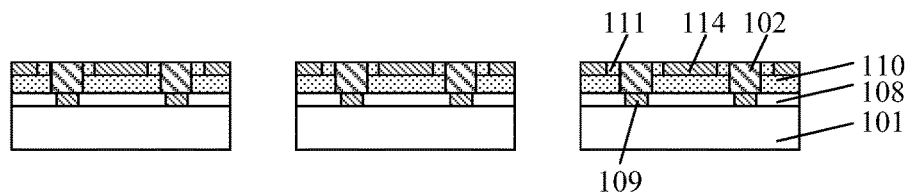

As illustrated in FIG. 16, a first soldering pad 102 may be formed in each first opening by filling the first opening with metal, and the bottom shielding layer 114 may be formed in the third openings by filling the third openings with metal. As illustrated in FIG. 17, after forming the first soldering pads 102 and the bottom shielding layer 114, the wafer 100 may be cut to form the discrete semiconductor chips 101 with the bottom shielding layer 114.

In some embodiments, the first soldering pads 102 and the bottom shielding layer 114 may be formed by a same process including: forming a metal material layer in the first openings, in the third openings, and on the isolation layers by a physical vapor deposition process, a sputtering process, or a plating process; planarizing the metal material layer to remove a portion of the metal material layer higher than the surfaces of the isolation layers and form a first soldering pad in each first opening and the bottom shielding layer 114 in the third openings. The metal material layer may be made of a material including aluminum, nickel, tin, tungsten, platinum, copper, titanium, chromium, tantalum, gold, silver, or a combination thereof.

Figure 18:
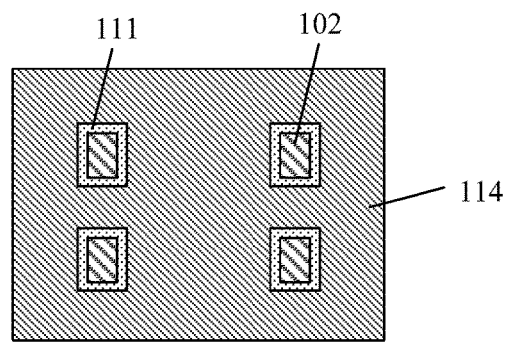

As illustrated in FIG. 17 and FIG. 18 which is a top view of the first soldering pads 102 and the bottom shielding layer 104 in FIG. 17, each semiconductor chip 101 of the discrete semiconductor chip 101 may include the bottom shielding layer 114 on the functional surface, and the bottom shielding layer 114 may cover the whole functional surface of the semiconductor chip 101. The surrounding edges of the bottom shielding layer 114 may be flush with the surrounding sidewalls of the semiconductor chip 101. The first soldering pads 102 may penetrate through the bottom shielding layer and may be isolated from the bottom shielding layer 114 by the isolation layers 111.

In the present embodiment, the process for forming the bottom shielding layer 114 may be integrated in the existing fabrication processes of the semiconductor chips, and may be performed synchronically with the process for forming the first soldering pads 102. The fabrication process may be simplified and the process difficulty may be reduced, to improve the efficiency.

Figure 19:
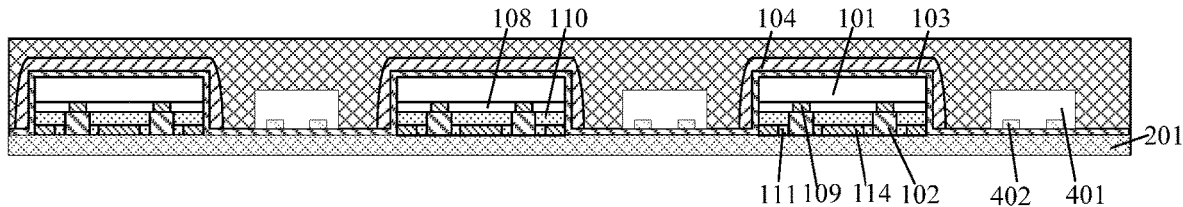

As illustrated in FIG. 19, the semiconductor chips 101 with the bottom shielding layer 114 may be adhered to the carrier plate 201, and the first soldering pads 102 and the bottom shielding layer 114 may be in contact with the carrier plate 201. The first shielding layer 103 may be formed to cover the non-functional surfaces and the sidewalls of the semiconductor chips 101. The electronic devices 401 that do not need shielding may be provided with second soldering pads 402 on the surfaces of the electronic devices 401. Each electronic device 401 that do not need shielding may be adhered to the carrier plate 201 at a side of a corresponding semiconductor chip 101. Surfaces of the electronic devices 401 that do not need shielding with the second soldering pads 402 may face to the adhesive surface of the carrier plate 201. The second shielding layer 104 may be formed on the first shielding layer 103.

Subsequently, the carrier plate 201 may be peeled off to form the pre-packaging plate 10. A back surface of the pre-packaging plate 10 may expose the first soldering pads 130 on the functional surfaces of the semiconductor chips and the second soldering pads 402 on the electronic devices 401 that do not need shielding. First external contact structures connected to the first soldering pads 130 and second external contact structures connected to the second soldering pads may be formed on the back surface of the pre-packaging plate 10.

It should be noted that other definitions or descriptions of the same or similar structures in the present embodiment as in the previous embodiments will not be repeated. For details, please refer to the definitions or descriptions of the corresponding parts in the previous embodiments.

The present disclosure also provides a packaging structure. As illustrated in FIG. 11 and FIG. 19, the packaging structure may include:

a pre-packaging plate 10, a plastic encapsulation layer 105 in the pre-packaging structure 10, semiconductor chips 101 in the plastic encapsulation layer 105, electronic devices 401 that do not need shielding in the plastic encapsulation layer 105, a first shielding layer 103 and a second shielding layer 104 between the semiconductor chips 101 and the plastic encapsulation layer 105, first external contact structures 12 on a back surface of the pre-packaging plate 10, and second external contact structures 125 on the back surface of the pre-packaging plate 10.

Each electronic device 401 that does not need shielding may be located at a side of a corresponding semiconductor chip 101. Each semiconductor chip 101 may include a functional surface and a non-functional surface opposite to the functional surface, first soldering pads 102 on the functional surfaces of the semiconductor chips 101. Second soldering pads 402 may be located on the surfaces of the electronic devices 401 that do not need shielding. The plastic encapsulation layer 105 may expose the first soldering pads 102 and the second soldering pads 402.

The first shielding layer 103 may surround non-functional surfaces and sidewalls of the semiconductor chips 101. The second shielding layer 104 may be disposed between the first shielding layer 103 and the plastic encapsulation layer 105, and may completely cover a surface of the first shielding layer 103 on the non-functional surfaces and sidewalls of the semiconductor chips 101. The first external contact structures 12 may be connected to the first soldering pads 102, and the second external contact structures 125 may be connected to the second soldering pads 402.

In one embodiment, the first shielding layer 103 may be formed by a sputtering process, and the second shielding layer 104 may be formed by a selective plating process, a dispensing process or a mesh printing process. The first shielding layer 103 may be made of a material including copper, tungsten, aluminum, or a combination thereof. The second shielding layer 104 may be made of a material including copper, solder, or conductive silver paste.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. The electric field shielding layer may be made of a material including copper, tungsten, or aluminum. The magnetic field shielding layer may be made of a material including CoFeB alloy, CoFeTa, NiFe, Co, CoFe, CoPt, or Ni—Co—Fe alloy.

In some embodiments, as illustrated in FIG. 19, the packaging structure may further include a bottom shielding layer 114 on the functional surfaces of the semiconductor chips 101. The bottom shielding layer 114 may cover the whole functional surfaces of the semiconductor chips 101, and may have surrounding edges flush with the sidewalls of the semiconductor chips 101. The first soldering pads 102 may penetrate through the bottom shielding layer 114, and may be isolated from the bottom shielding layer 114 through isolation layers 111. The first plastic encapsulation layer 132 may cover the bottom shielding layer 114. The first shielding layer 103 may be connected to surrounding edges of the bottom shielding layer 114.

In one embodiment, each first external contact structure may include a rewiring layer 123 on a backside of the pre-packaging plate and connected to a corresponding first soldering pad 102, and an external contact part 124 on and connected to the rewiring layer 123.

The pre-packaging plate may include a first insulating layer 121 on the backside of the pre-packaging plate 10. The first insulating layer 121 may include first openings exposing surfaces of the first soldering pads 102 and second openings exposing surfaces of the second soldering pads 402. Each rewiring layer 123 may be located in a corresponding first opening and on a portion of the first insulating layer 121, and each external contact part 124 may be located on a surface of a corresponding rewiring layer 123 outside a corresponding first opening. Each second external contact structure 125 may be located in a corresponding second opening.

The packaging structure may further include a second insulating layer 122 covering the first insulating layer 121. A portion of each external contact part 124 may be located in the second insulating layer 122. A portion of each second external contact structure 125 may be located in the first insulating layer 122.

In some embodiments, the packaging structure may further include a conductive contact structure (not shown in the figures) in the first insulating layer 121 and electrically connected the first shielding layer 103 to a portion of a corresponding rewiring layer 123.

Figure 20:
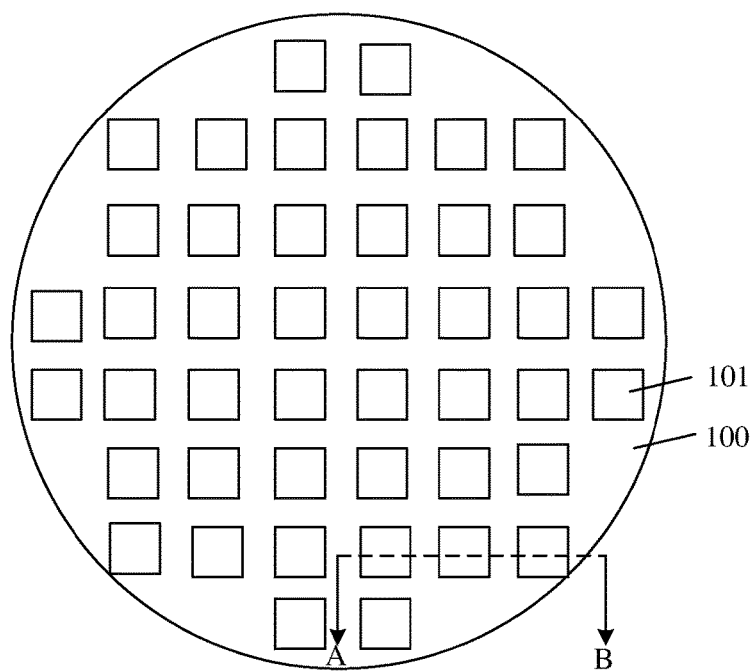
FIGS. 20-32 illustrate structures corresponding to certain stages in another exemplary fabrication method for forming a packaging structure according to various disclosed embodiments of the present disclosure.
Figure 21:
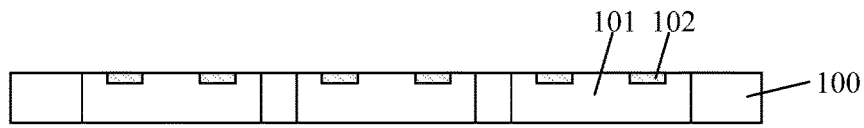
Figure 22:
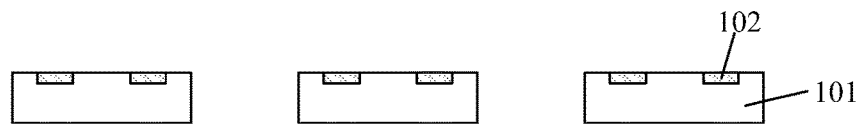

The present disclosure also provides another fabrication method for forming a packaging structure, as illustrated in FIGS. 20-32. The method may include: after adhering functional surfaces of semiconductor chips to a carrier plate, forming a first shielding layer to cover non-functional surfaces and sidewalls of the semiconductor chips, where the first shielding layer may has an ellipsoidal surface on each semiconductor chip; adhering electronic devices that do not need shielding on the carrier plate at sides of each semiconductor chip correspondingly such that surfaces of the electronic devices with second first soldering pads that do not need shielding may face an adhering surface of the carrier plate; forming a second shielding layer; forming a plastic encapsulation layer covering the second shielding layer, the electronic devices that do not need shielding, and the carrier plate; peeling off the carrier plate to form a pre-packaging plate, such that a backside of the pre-packaging plate may expose first soldering pads on the semiconductor chips and the second first soldering pads on the electronic devices that do not need shielding; and forming first external contact structures connected to the first soldering pads and second external contact structures connected to the second first soldering pads. The first shielding layer with the ellipsoidal surface on each semiconductor chip may evenly and completely cover the non-functional surfaces and sidewalls of the semiconductor chips. By forming the second shielding layer on the ellipsoidal surfaces of the first shielding layer, uneven thickness and poor edge coverage of the second shielding layer may be prevented, thereby making an overall shield layer formed by the first shielding layer and the second shielding layer complete, to improve shielding performance As illustrated in FIGS. 20-22 where FIG. 21 is a cross-section view along an A'B' direction in FIG. 20. Semiconductor chips 101 may be provided. Each semiconductor chip 101 may include a functional surface and a non-functional surface opposite to the functional surface. First soldering pads 102 may be disposed on the functional surface and a first soldering pad 103 may be formed on each first soldering pad 102, in each semiconductor chip 101. A first plastic encapsulation layer 132 may be formed on functional surfaces of the semiconductor chips 101 to cover first soldering pads 130 on the semiconductor chips 101.

In each semiconductor chip 101, integrated circuits (not shown in the figures) may be formed on the functional surface, and the first soldering pads 102 may be disposed on the functional surface. The first soldering pads 102 may be electrically connected to the integrated circuits in the semiconductor chip 101 and may be used as terminals for electrically connecting the integrated circuits in the semiconductor chip 101 to external circuits.

In each semiconductor chip 101, the functional surface may be a surface for forming the integrated circuits and the non-functional surface may be a surface opposite to the functional surface, while surrounding surfaces between the functional surface and the non-functional surface may be sidewalls of the semiconductor chip 101.

The semiconductor chips 101 may be formed by a semiconductor integration manufacturing process. As illustrated in FIGS. 20-21, a wafer 100 may be provided. The wafer 100 may include chip areas arranged in rows and columns, and cutting path areas between the chip areas. The semiconductor chips 101 may be formed correspondingly in the chip areas of the wafer 100. The first soldering pads 102 may be formed on the functional surfaces of the semiconductor chips 101. As illustrated in FIG. 22, the wafer 100 may be cut along the cutting path to form the discrete semiconductor chips 101.

In one embodiment, the wafer 100 may be made of a material including single-crystalline silicon, single-crystalline germanium, GeSi, SiC, silicon on an insulator (SOI), germanium on an insulator (GOI), or other materials including III-V compounds such as GaAs.

In one embodiment, integrated circuits in the semiconductor chips 101 may include semiconductor devices (such as transistors, memories, or diodes) and/or interconnection structures connecting the semiconductor devices (such as metal wires or metal plugs).

In one embodiment, the semiconductor chips may be semiconductor chips requiring electromagnetic shielding.

Figure 23:
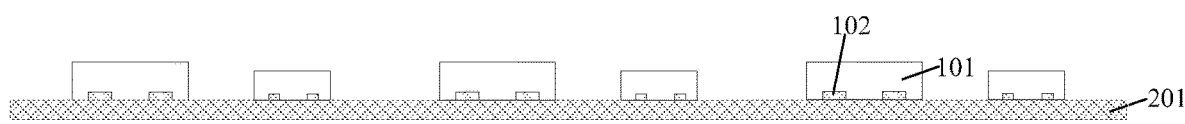

As illustrated in FIG. 23, a carrier plate 201 may be provided and the functional surfaces of the semiconductor chips 101 may be adhered to the carrier plate 210.

The carrier plate 201 may provide a support platform for subsequent processes. In one embodiment, the carrier plate 210 may be a glass carrier plate, a silicon carrier plate, or a metal carrier plate. In some other embodiments, the carrier plate 210 may be a carrier plate made of other suitable materials.

The semiconductor chips 101 may be adhered to the carrier plate 210 through an adhesive layer, and the functional surfaces of the semiconductor chips 101 (or the first soldering pads 102) may face an adhesive surface of the carrier plate 201.

The adhesive layer may be made of any suitable material. In one embodiment, the adhesive layer may be made of UV glue. The UV glue may be an adhesive material that can react to ultraviolet light with a special wavelength. The UV glue may include two types according to change in its viscosity after ultraviolet light irradiation. One type of the UV glue may be a UV curing glue. A photoinitiator or photosensitizer of a material of the UV curing glue may absorb the ultraviolet light under ultraviolet radiation to generate active radicals or cations. Correspondingly, monomer polymerization, cross-linking, or grafting chemical reactions may be initiated to make the UV curing glue change from liquid to solid in a few seconds, thereby bonding the UV curving glue with a surface of an object in contact with the UV curing glue. Another type of the UV glue may have a high viscosity when not exposed to the ultraviolet irradiation. After the ultraviolet irradiation, cross-linking chemical bonds in a material of the UV glue may be broken, resulting in a significant decrease or disappearance of the viscosity. In one embodiment, the UV glue in the adhesive layer may be the latter, and may be formed by a film sticking process, a glue printing process, or a rolling glue process.

In some other embodiments, the adhesive layer may be made of a material including epoxy glue, polyimide glue, polyethylene glue, benzocyclobutene glue, or polybenzoxazole glue.

The semiconductor chips 201 may be adhered to the carrier plate 201 evenly in rows and columns.

As illustrated in FIG. 23, electronic devices 401 that do not need shielding may be provided. The electronic devices 401 that do not need shielding may include second soldering pads 402 on surfaces of the electronic devices 401. Each electronic device 401 that does not need shielding may be adhered to the carrier plate 201 at a side of a corresponding semiconductor chip 101. A surface of the electronic devices 401 that do not need shielding with the second soldering pads 401 may face the adhesive surface of the carrier plate 201.

The electronic devices 401 that do not need shielding may be electro devices that do not need electromagnetic shielding, and may include heterogeneous chips or passive elements. The heterogeneous chips may include chips with functions or types different from the semiconductor chips 101. The passive elements may include capacitors or inductors.

Each electronic device 401 that does not need shielding may be adhered to the carrier plate 201 at a side of a corresponding semiconductor chip 101. After cutting the pre-packaging plate subsequently, each semiconductor chip 101 and a corresponding electronic device 401 that does not need shielding may be packaged into a same discrete packaging structure.

In one embodiment, the electronic devices 401 that do not need shielding and the semiconductor chips 101 may be adhered to the carrier plate 201 through the same adhesive layer.

Figure 24:
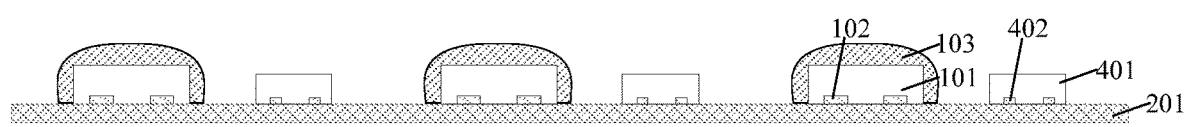

As illustrated in FIG. 24, a first shielding layer 103 may be formed to cover the non-functional surfaces and the sidewalls of the semiconductor chips 101.

In one embodiment, the first shielding layer 103 may cover the non-functional surfaces and the sidewalls of the semiconductor chips 101, and also cover surfaces of a portion of the carrier plate 201 between the semiconductor chips 101. In some other embodiments, the first shielding layer 103 may only cover the non-functional surfaces and the sidewalls of the semiconductor chips 101.

In one embodiment, the first shielding layer may be formed by a sputtering process, and may be made of a material including copper, tungsten, or aluminum. Since each of the semiconductor chips 101 may have four apex angles (at right angles), a large thickness, and steep sidewalls (angles between the sidewalls and the surface of the carrier plate 201 may be 90 degrees), the first shielding layer 103 formed by the sputtering process may have problems of uneven thickness and poor edge coverage.

In one embodiment, the formed first shielding layer 103 may be a shielding layer for electric field and magnetic field, and may be used for shielding the electric field and the magnetic field. The second shielding layer formed subsequently may also be a shielding layer for the electric field and the magnetic field, and may be used for shielding the electric field and the magnetic field.

A shielding layer may be needed to shielding the electric field and the magnetic field. An existing single-layer shielding layer with a specific material or an existing shielding layer including multilayer same or similar materials may only have a good shielding effect for the electric field, and have a weak shielding effect for the magnetic field. The shielding performance may be poor. In some other embodiments, the first shielding layer 103 may be a shielding layer for the magnetic field, and may be used for shielding the magnetic field. The second shielding layer formed subsequently may be a shielding layer for the electric field, and may be used for shielding the electric field. In some other embodiments, the first shielding layer 103 may be a shielding layer for the electric field, and may be used for shielding the electric field. The second shielding layer formed subsequently may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the first shielding layer 103 is the electric field shielding layer, the first shield layer 103 (the electric field shielding layer) may be made of a material including copper, tungsten, or aluminum. When the first shielding layer 103 is a magnetic field shielding layer, the first shield layer 103 (the magnetic field shielding layer) may be made of a material including CoFeB alloy, CoFeTa, NiFe, Co, CoFe, CoPt, or Ni—Co—Fe alloy. The first shielding layer 103 may be formed by a sputtering process, a physical vapor deposition process, an atomic layer deposition process, a chemical vapor deposition process, or any other suitable processes.

Figure 25:
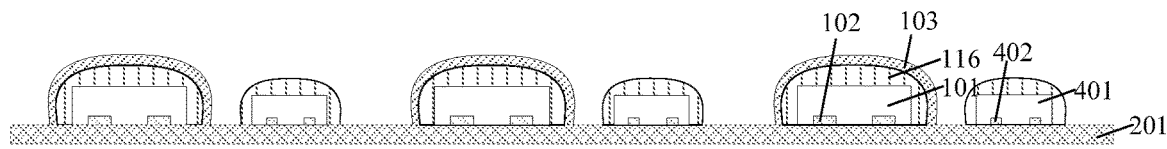

In some other embodiments illustrated in FIG. 25, an intermediate material layer 116 with ellipsoidal surfaces may be formed on the non-functional surfaces and the sidewalls of the semiconductor chips 101, and the first shielding layer 103 may be formed on the intermediate material layer 116 and may also have ellipsoidal surfaces. By forming the intermediate material layer 116 with ellipsoidal surfaces, the first shielding layer 103 made of different materials may be formed by various suitable processes and the formed first shielding layer 103 may also have ellipsoidal surfaces. When forming the first shielding layer 103 on the intermediate material layer 116 with ellipsoidal surfaces, the first shielding layer 103 may not be affected by sharp angles and/or steep sidewalls. Correspondingly, the integrity of the shielding layer may be improved.

In some embodiments, the intermediate material layer 116 may be made of a material including non-conductive glue, conductive silver paste, fluid resin, or solder. The intermediate material layer may be formed by a dispensing process or a mesh printing process. The first shielding layer with the ellipsoidal surface may be formed by a sputtering process, a selective plating process, a dispensing process, or a mesh printing process. The first shielding layer may be made of a material including copper, tungsten, aluminum, solder, or conductive silver paste. The first shielding layer may also be made of a material of the magnetic field shielding layer and electric field shielding layer.

In one embodiment, the intermediate material layer 116 may further cover sidewalls and top surfaces of the electronic devices 402 that do not need shielding. In some other embodiments, the intermediate material layer 116 may be formed only on the non-functional surfaces and the sidewalls of the semiconductor chips 101.

Figure 26:
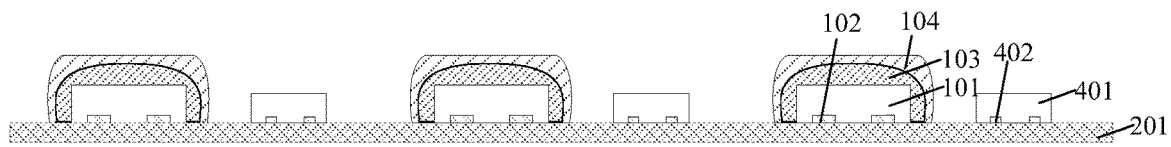

As illustrated in FIG. 26, a second shielding layer 104 may be formed on the first shielding layer 103.

By forming the second shielding layer 104 on the first shielding layer 103, the second shielding layer 104 may cover a portion of the first shielding layer 103 with the uneven thickness and poor edge coverage. Correspondingly, the overall shielding layer constituted by the first shielding layer 103 and the second shielding layer 104 may be complete, improving the shielding performance.

In one embodiment, the second shielding layer 104 may be only located on a portion of the surface of the first shielding layer 103 on the non-functional surfaces and the sidewalls of the semiconductor chips 101. The second shielding layer 104 may have ellipsoidal surfaces. The second shielding layer 104 may be formed by a selective plating process, a dispensing process or a mesh printing process, so that the formed second shielding layer 104 can better cover the first shielding layer and prevent the second shielding layer 104 from forming areas with poor coverage. Correspondingly, the integrity of the overall shield layer formed by both the first shield layer 103 and the second shield layer 104 may be further ensured, and the subsequent removal of the semiconductor chips may not need additional masking and etching processes.

In one embodiment, the second shielding layer 104 may be made of a material including copper, solder, or conductive silver paste. In one embodiment, the second shielding layer 104 may be formed by: forming a mask layer (not shown in the figures) on the carrier plate 201 where the mask layer includes openings exposing the portion of the first shielding layer 103 on the non-functional surfaces and the sidewalls of the semiconductor chips 101; forming the second shielding layer 104 in the openings by using the first shielding layer as a conductive layer in the plating process to electroplate, or brushing the solder into the openings to form the second shielding layer 104 directly; and removing the mask layer.

In another embodiment, the second shielding layer 104 may be made of solder or conductive silver paste, and may be formed by the dispensing process or the mesh printing process correspondingly. When performing the dispensing process, the solder or the conductive silver paste may be applied on a surface of the portion of the first shielding layer 103 on the non-functional surfaces and the sidewalls of the semiconductor chips 101. When performing the mesh printing process, a mesh plate with meshes may be placed on the carrier plate 201 and each of the semiconductor chips may be placed in a correspondingly mesh in the mesh plate. Subsequently, the solder may be brushed into the meshes and the solder may cover the surface of the portion of the first shielding layer 103 on the non-functional surfaces and the sidewalls of the semiconductor chips 101. Then the mesh plate may be removed and the solder may be reflowed to form the second shielding layer 104.

In one embodiment, the solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

In some other embodiments, the second shielding layer 104 may be formed by a sputtering process, and may be made of a metal including copper, tungsten, or aluminum. The second shielding layer 104 may cover the portion of the first shielding layer 103 on the non-functional surfaces and the sidewalls of the semiconductor chips 101. The second shielding layer may also cover the portion of the carrier plate 201 at two sides of the semiconductor chips 101, and the surfaces of the electronic devices 401 that do not need shielding. After the sputtering process, a portion of the first shielding layer on the portion of the carrier plate 201 at two sides of the semiconductor chips 101 and the surfaces of the electronic devices 401 that do not need shielding.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the second shielding layer 104 is the electric field shielding layer, the second shielding layer 104 (the electric field shielding layer) may be made of a material including copper, tungsten, or aluminum. When the second shielding layer 104 is a magnetic field shielding layer, the second shielding layer 104 (the magnetic field shielding layer) may be made of a material including CoFeB alloy, CoFeTa, NiFe, Co, CoFe, CoPt, or Ni—Co—Fe alloy. The second shielding layer 104 may be formed by a sputtering process, a physical vapor deposition process, an atomic layer deposition process, a chemical vapor deposition process, or any other suitable processes.

Figure 27:
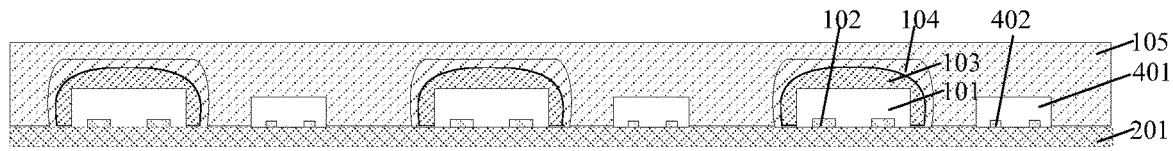

As illustrated in FIG. 27, a plastic encapsulation layer 105 may be formed to cover the second shielding layer 104, the electronic devices 401 that do not need shielding, and the carrier plate 201.

The plastic encapsulation layer 105 may encapsulate and fix the semiconductor chips 101 and the electronic devices 401 that do not need shielding, for forming a pre-packaging plate subsequently.

The plastic encapsulation layer 105 may be made of a material including epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol, or a combination thereof.

The plastic encapsulation layer 105 may be formed by an injection molding process, a transfer molding process, or any other suitable processes.

Figure 28:
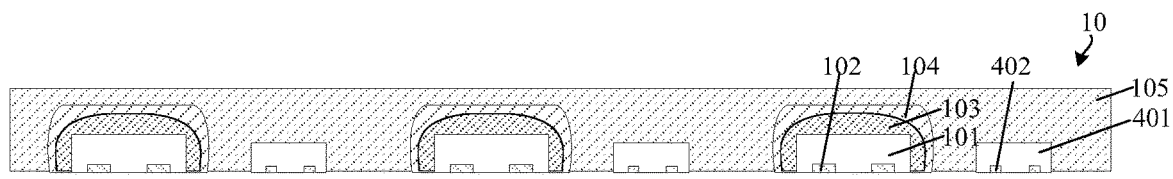

As illustrated in FIG. 28, the carrier plate 201 may be peeled off to form the pre-packaging plate 10, such that a back surface of the pre-packaging plate 10 may expose the first soldering pads 102 on the functional surfaces of the semiconductor chips 101 and the second soldering pads 402 of the electronic devices 401 that do not need shielding.

The adhesive layer may be removed by a process including chemical etching, mechanical peeling, CMP, mechanical grinding, or hot baking, to peel off the carrier plate 201.

The back surface of the pre-packaging plate 10 may be a surface in contact with the carrier plate 201.

In one embodiment, after peeling off the carrier plate 201, a portion of the first shielding layer 103 on a portion of the back surface of the pre-packaging plate 10 at a side of a corresponding semiconductor chip 101 may be removed by a wet or dry etch process. When removing a portion of the first shielding layer 103 on a portion of the back surface of the pre-packaging plate 10 at a side of a corresponding semiconductor chip 101, another portion of the first shielding layer 103 on the surfaces of the second soldering pads 402 may be preserved or removed.

Figure 29:
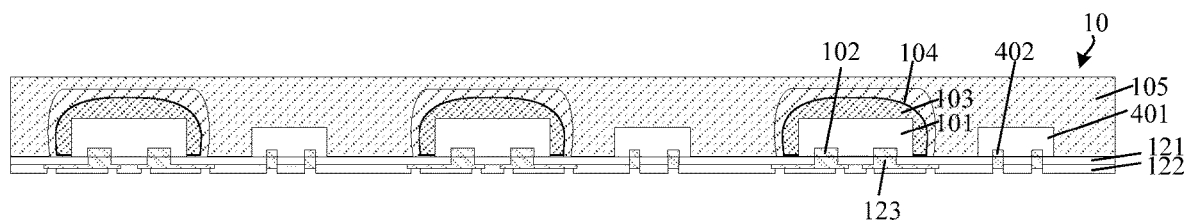
Figure 30:
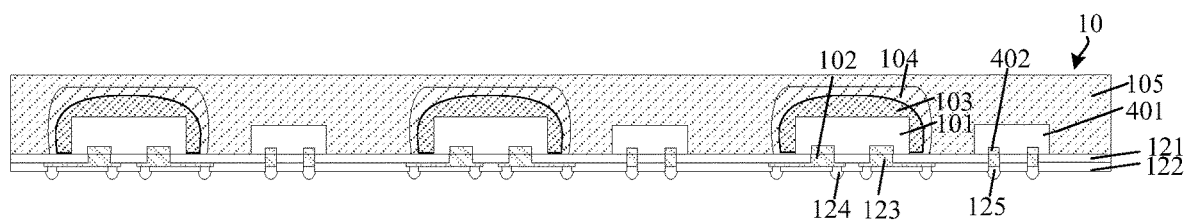

As illustrated in FIGS. 29-30, a first external contact structure connected to each first soldering pad 102 may be formed on the back surface of the pre-packaging plate 10.

In one embodiment, each first external contact structure may include a rewiring layer 123 connected to a first soldering pad 102 on the back surface of the pre-packaging plate 10 and external contact parts 124 on and connected to the rewiring layer 123. Each first soldering pad 102 of each semiconductor chip 101 may be connected to corresponding external contact parts 124.

In one embodiment, rewiring layers 123 and external contact parts 124 in external contact structures of the semiconductor chips 101 may be formed by: forming an insulating layer (a first insulating layer) 121 on the back surface of the pre-packaging plate 10 where the insulating layer (the first insulating layer) 121 includes openings exposing the first soldering pads 130; forming a rewiring layer 123 in each opening and on a surface of a portion of the insulating layer (the first insulating layer) 121; and forming the external contact parts 124 on a portion of each rewiring layer 123 outside a corresponding opening. The insulating layer (the first insulating layer) 121 may be made of a material including SiN, silicon-boron glass, silicon-phosphor glass, silicon-boron-phosphor glass, or a combination thereof. In one embodiment, each external contact part 123 may be a soldering ball or include a metal post and a soldering ball on the metal post. The external contact parts 123 may be formed by: forming a second insulating layer 122 on the first insulating layer 121 and on the rewiring layers 123, where the second insulating layer 122 may include third openings exposing a portion of a surface of each rewiring layer 123 on the surface of the first insulating layer 121; and forming the external contact parts 124 in the third openings.

The first insulating layer 121 and the second insulating layer 122 may further include second openings exposing the surfaces of the second soldering pads 402 or surfaces of a portion of the first shielding layer on the second soldering pads 402, and second external contact structures 125 may be formed in the second openings.

Each second external contact structure 125 may be a soldering ball or include a metal post and a soldering ball on the metal post.

In one embodiment, conductive contact structures (not shown in the figures) may be further formed on the first insulating layer 121 to electrically connect the first shielding layer 103 to a portion of the rewiring layers 123. Correspondingly, the first shielding layer may discharge through the portion of the rewiring layers 123 or block external static electrical interference.

In some embodiments, the method further including forming wires connecting a portion of the first soldering pads 102 of the semiconductor chips to a portion of the second soldering pads 402 of the electronic devices 402 that do not need shielding (not shown in the figures), such that the electrical signals can transmit between the semiconductor chips and the electronic devices 402 that do not need shielding. Correspondingly, the semiconductor chips and the electronic devices 402 that do not need shielding can process the signals from each other, and the performance of the packaging structure may be improved.

Figure 31:
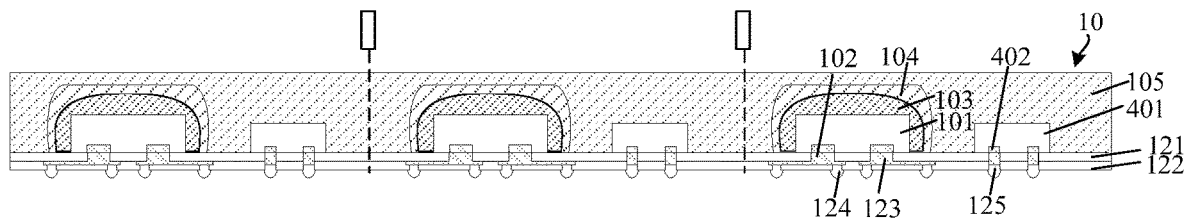
Figure 32:
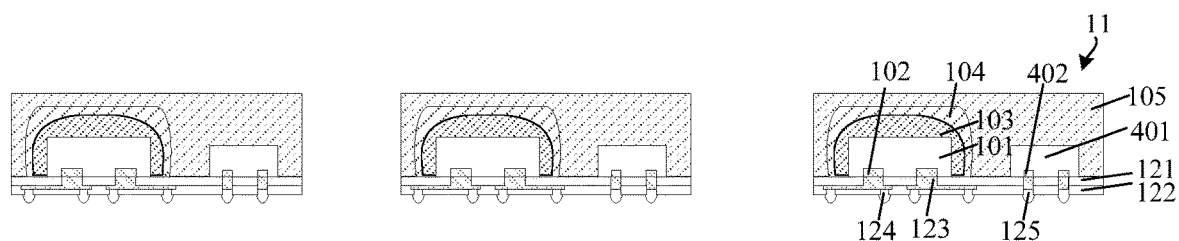

As illustrated in FIGS. 31-32, after forming the first and second external contact structures, the pre-packaging plate may be cut to form discrete packaging structures 11.

Each of the discrete packaging structures 11 may include the plastic encapsulation layer 105, and a semiconductor chip 101 in the plastic encapsulation layer 105, and an electronic device 401 that does not need shielding at a side of the semiconductor chip 101. The semiconductor chip 101 may include a functional surface and a non-functional surface opposite to the functional surface. First soldering pads 102 may be disposed on the functional surface of the semiconductor chip 101, and second soldering pads 402 may be formed on the electronic device 401 that does not need shielding. The plastic encapsulation layer 105 may expose the first soldering pads 102 and the second soldering pads 402. The discrete packaging structure 11 may further include a first shielding layer 103 and a second shielding layer 104 between the semiconductor chip 101 and the plastic encapsulation layer 105, and between the first plastic encapsulation layer 132 and the plastic encapsulation layer 105. The first shielding layer 132 may cover the non-functional surface and the sidewalls of the semiconductor chip 101, and may have ellipsoidal surfaces. The second shielding layer 104 may be disposed between the first shielding layer 103 and the plastic encapsulation layer 105, and may completely cover a surface of a portion of the first shielding layer 103 on the non-functional surface and the sidewalls of the semiconductor chip 101.

The packaging structure 11 may further include first external contact structures connected to the first soldering pads 101 on the semiconductor chip 101 and second external contact structures connected to the second soldering pads 402 on the electronic device 401 that does not need shielding. The first and the second external contact structures are formed on the back surface of the plastic encapsulation layer 105.

In the present disclosure, massive production of the packaging structure 11 with the first shielding layer 103 and the second shielding layer 104 may be achieved by the above semiconductor integration fabrication process. Producing efficiency may be improved.

The present disclosure also provides another fabrication method for forming a packaging structure. FIGS. 33-38 illustrate semiconductor structures corresponding to different stages in the fabrication method for forming a packaging structure. In comparison to the previous fabrication method, in the present method, a bottom shielding layer may be formed on the functional surfaces of the semiconductor chips. The bottom shielding layer may completely cover the functional surfaces of the semiconductor chips, and have surrounding edges flush with surrounding sidewalls of the semiconductor chips. The first soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

Figure 33:
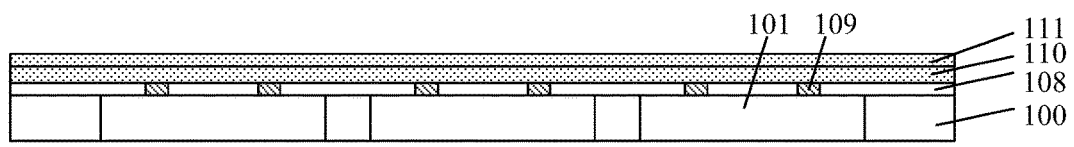

The semiconductor chips with the bottom shielding layer may be formed by the following processes. As illustrated in FIG. 33, a wafer 100 and semiconductor chips 101 on the wafer 100 may be provided. Each semiconductor chip 101 of the semiconductor chips 101 may include a top dielectric layer 108 and a top interconnection structure 109 in the top dielectric layer 108. The semiconductor chip 101 may further include semiconductor devices (such as transistors) formed on a surface of the wafer 100 (or on a semiconductor substrate), interlayer dielectric layers between the top dielectric layer 108 and the surface of the wafer 100. Each of the interlayer dielectric layers may include a corresponding interconnection structure. Interconnection structures in the interlayer dielectric layers may connect upper or lower layers, or electrically connected to the semiconductor devices. The top interconnection structure 109 in the top dielectric layer 108 may be electrically connected to an interconnection structure in an adjacent interlayer dielectric layer of the interlayer dielectric layers.

Subsequently, an isolation layer may be formed on each top dielectric layer 108.

In one embodiment, each isolation layer may have a multilayer structure, and may include a first isolation layer 110 and a second isolation layer 111 on the first isolation layer 110. The first isolation 110 and the second isolation layer 111 may be made of different materials. The first isolation 110 and the second isolation layer 111 may be made of one of SiO2, SiN, or SiNO respectively, to achieve precise control of depth of third openings formed subsequently. Correspondingly, when forming the third openings, an excessive etching of the isolation layer which may induce exposing of a portion of a surface of the top interconnection structure 109 on the top dielectric layer 108 by the third openings and short circuits between top interconnection structures 109 when forming the bottom shielding layer in the third openings, may be prevented.

In some other embodiments, each isolation layer may have a single-layer structure.

Figure 34:
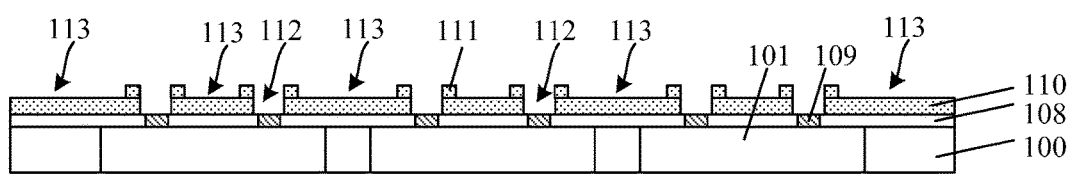

As illustrated in FIG. 34, the isolation layers may be etched to form first openings 112 and third openings 113 surrounding the first openings 112. A remaining portion of the isolation layers may be only located between the first openings 112 and the third openings 113, to separate the first openings 112 from the third openings 113.

The first openings 112 may be discrete and penetrate through the isolation layers 111. Each first opening 112 may expose a portion of a surface of a corresponding interconnection structure 109. The first openings 112 may be filled with metal to form the first soldering pads.

Each third opening 113 may surround a corresponding first opening 112, and may be separated from the corresponding first opening 112 through the isolation layers 111. Each third opening 113 may have a depth smaller than a thickness of the isolation layer. All areas outside the first openings 112 and outside the isolation layer 111 surrounding the first openings 112 may correspond to areas of the third openings 113. The third openings 113 may be connected. When forming the bottom shielding layer in the third openings 113, the bottom shielding layer may cover all areas of the functional surfaces of the semiconductor chips 101 except for the first soldering pads (formed in the first openings 112) and the isolation layer surrounding the first soldering pads. When forming the first shielding layer on the non-functional surfaces and the sidewalls of the semiconductor chips 101, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In one embodiment, the second isolation layers 111 may be etched using a first etch process with the first isolation layers 110 as a stop layer, to form the third openings in the second isolation layers 111. Subsequently, the second isolation layers 111 and the first isolation layers 110 may be etched using a second etch process, to form the first openings in the second isolation layers 111 and the first isolation layers 110. Before the first and the second etch processes, a corresponding mask layer may be formed on the second isolation layers. In some other embodiment, the second etch process may be performed before the first etch process.

In some other embodiments, each isolation layer may have a single-layer structure, and the first openings and the third openings may be formed by two etch processes respectively. Depth of the third openings may be controlled by controlling the etch time of the etch process (the depth of the third openings may be smaller than the thickness of the isolation layers).

Figure 35:
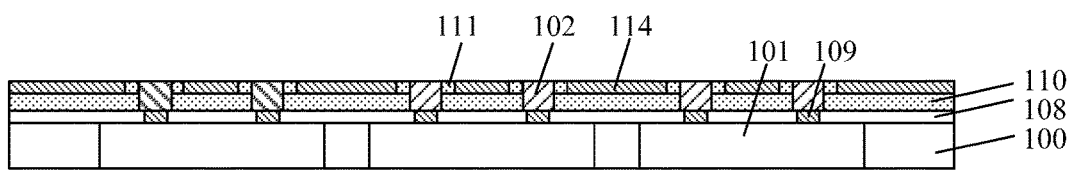

As illustrated in FIG. 35, a first soldering pad 102 may be formed in each first opening by filling the first opening with metal, and the bottom shielding layer 114 may be formed in the third openings by filling the third openings with metal. As illustrated in FIG. 17, after forming the first soldering pads 102 and the bottom shielding layer 114, the wafer 100 may be cut to form the discrete semiconductor chips 101 with the bottom shielding layer 114.

In some embodiments, the first soldering pads 102 and the bottom shielding layer 114 may be formed by a same process including: forming a metal material layer in the first openings, in the third openings, and on the isolation layers by a physical vapor deposition process, a sputtering process, or a plating process; planarizing the metal material layer to remove a portion of the metal material layer higher than the surfaces of the isolation layers and form a first soldering pad in each first opening and the bottom shielding layer 114 in the third openings. The metal material layer may be made of a material including aluminum, nickel, tin, tungsten, platinum, copper, titanium, chromium, tantalum, gold, silver, or a combination thereof.

Figure 36:
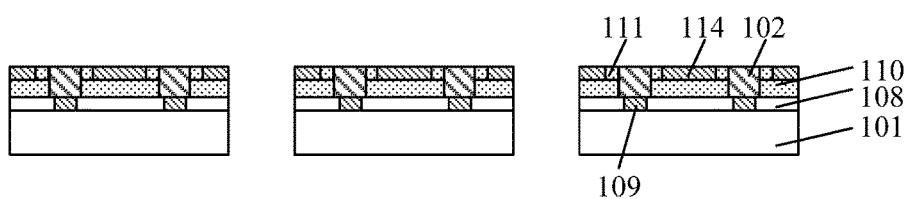
Figure 37:
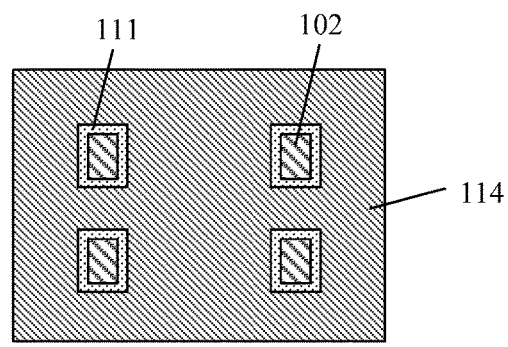

As illustrated in FIG. 36 and FIG. 37 which is a top view of the first soldering pads 102 and the bottom shielding layer 104 in FIG. 36, each semiconductor chip 101 of the discrete semiconductor chip 101 may include the bottom shielding layer 114 on the functional surface, and the bottom shielding layer 114 may cover the whole functional surface of the semiconductor chip 101. The surrounding edges of the bottom shielding layer 114 may be flush with the surrounding sidewalls of the semiconductor chip 101. The first soldering pads 102 may penetrate through the bottom shielding layer and may be isolated from the bottom shielding layer 114 by the isolation layers 111.

In the present embodiment, the process for forming the bottom shielding layer 114 may be integrated in the existing fabrication processes of the semiconductor chips, and may be performed synchronically with the process for forming the first soldering pads 102. The fabrication process may be simplified and the process difficulty may be reduced, to improve the efficiency.

Figure 38:
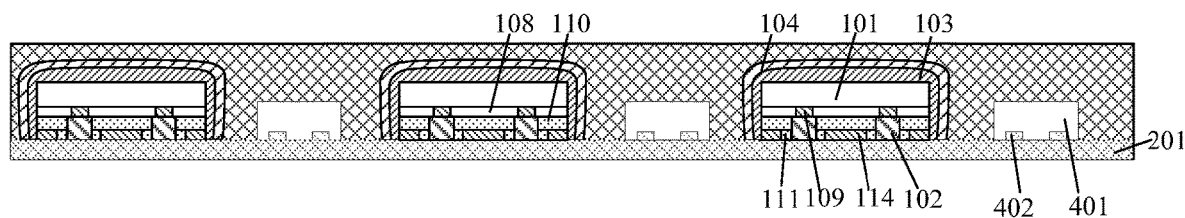

As illustrated in FIG. 38, the semiconductor chips 101 with the bottom shielding layer 114 may be adhered to the carrier plate 201, and the first soldering pads 102 and the bottom shielding layer 114 may be in contact with the carrier plate 201. The first shielding layer 103 may be formed to cover the non-functional surfaces and the sidewalls of the semiconductor chips 101. The electronic devices 401 that do not need shielding may be provided with second soldering pads 402 on the surfaces of the electronic devices 401. Each electronic device 401 that do not need shielding may be adhered to the carrier plate 201 at a side of a corresponding semiconductor chip 101. Surfaces of the electronic devices 401 that do not need shielding with the second soldering pads 402 may face to the adhesive surface of the carrier plate 201. The second shielding layer 104 may be formed on the first shielding layer 103.

Subsequently, the carrier plate 201 may be peeled off to form the pre-packaging plate 10. A back surface of the pre-packaging plate 10 may expose the first soldering pads 130 on the functional surfaces of the semiconductor chips and the second soldering pads 402 on the electronic devices 401 that do not need shielding. First external contact structures connected to the first soldering pads 130 and second external contact structures connected to the second soldering pads may be formed on the back surface of the pre-packaging plate 10.

It should be noted that other definitions or descriptions of the same or similar structures in the present embodiment as in the previous embodiments will not be repeated. For details, please refer to the definitions or descriptions of the corresponding parts in the previous embodiments.

The present disclosure also provides a packaging structure. As illustrated in FIG. 30 and FIG. 38, the packaging structure may include: a pre-packaging plate 10, a plastic encapsulation layer 105 in the pre-packaging structure 10, semiconductor chips 101 in the plastic encapsulation layer 105, electronic devices 401 that do not need shielding in the plastic encapsulation layer 105, a first shielding layer 103 and a second shielding layer 104 between the semiconductor chips 101 and the plastic encapsulation layer 105, first external contact structures 12 on a back surface of the pre-packaging plate 10, and second external contact structures 125 on the back surface of the pre-packaging plate 10.

Each electronic device 401 that does not need shielding may be located at a side of a corresponding semiconductor chip 101. Each semiconductor chip 101 may include a functional surface and a non-functional surface opposite to the functional surface, first soldering pads 102 on the functional surfaces of the semiconductor chips 101. Second soldering pads 402 may be located on the surfaces of the electronic devices 401 that do not need shielding. The plastic encapsulation layer 105 may expose the first soldering pads 102 and the second soldering pads 402.

The first shielding layer 103 may surround non-functional surfaces and sidewalls of the semiconductor chips 101, and may have ellipsoidal surfaces. The second shielding layer 104 may be disposed between the first shielding layer 103 and the plastic encapsulation layer 105, and may completely cover a surface of the first shielding layer 103 on the non-functional surfaces and sidewalls of the semiconductor chips 101. The first external contact structures 12 may be connected to the first soldering pads 102, and the second external contact structures 125 may be connected to the second soldering pads 402.

In one embodiment, the first shielding layer 103 may be formed by a dispersing process or a mesh printing process on the non-functional surfaces and sidewalls of the semiconductor chips. The second shielding layer 104 may be formed by a sputtering process, a selective plating process, a dispensing process or a mesh printing process. The first shielding layer 103 may be made of a material including solder or conductive silver paste. The second shielding layer 104 may be made of a material including copper, tungsten, aluminum, solder, or conductive silver paste.

In some embodiment, the packaging structure may further include an intermediate material layer 116 on the non-functional surfaces and sidewalls of the semiconductor chips. The intermediate material layer 116 may have ellipsoidal surfaces and the first shielding layer 103 may be located on the intermediate material layer 116 and may also have ellipsoidal surfaces.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. The electric field shielding layer may be made of a material including copper, tungsten, or aluminum. The magnetic field shielding layer may be made of a material including CoFeB alloy, CoFeTa, NiFe, Co, CoFe, CoPt, or Ni—Co—Fe alloy.

In some embodiments, as illustrated in FIG. 38, the packaging structure may further include a bottom shielding layer 114 on the functional surfaces of the semiconductor chips 101. The bottom shielding layer 114 may cover the whole functional surfaces of the semiconductor chips 101, and may have surrounding edges flush with the sidewalls of the semiconductor chips 101. The first soldering pads 102 may penetrate through the bottom shielding layer 114, and may be isolated from the bottom shielding layer 114 through isolation layers 111. The first plastic encapsulation layer 132 may cover the bottom shielding layer 114. The first shielding layer 103 may be connected to surrounding edges of the bottom shielding layer 114.

In one embodiment, each first external contact structure may include a rewiring layer 123 on a backside of the pre-packaging plate and connected to a corresponding first soldering pad 102, and an external contact part 124 on and connected to the rewiring layer 123.

The pre-packaging plate may include a first insulating layer 121 on the backside of the pre-packaging plate 10. The first insulating layer 121 may include first openings exposing surfaces of the first soldering pads 102 and second openings exposing surfaces of the second soldering pads 402. Each rewiring layer 123 may be located in a corresponding first opening and on a portion of the first insulating layer 121, and each external contact part 124 may be located on a surface of a corresponding rewiring layer 123 outside a corresponding first opening. Each second external contact structure 125 may be located in a corresponding second opening.

The packaging structure may further include a second insulating layer 122 covering the first insulating layer 121. A portion of each external contact part 124 may be located in the second insulating layer 122. A portion of each second external contact structure 125 may be located in the first insulating layer 122.

In some embodiments, the packaging structure may further include a conductive contact structure (not shown in the figures) in the first insulating layer 121 and electrically connected the first shielding layer 103 to a portion of a corresponding rewiring layer 123.

In the present disclosure, the functional surfaces of the semiconductor chips may be adhered to the carrier plate, and the first shielding layer may be formed to cover the non-functional surfaces and the sidewalls of the semiconductor chips. Each electronic device that does not need shielding may be adhered to the carrier plate at a side of a corresponding semiconductor chip such that a surface of the electronic device that does not need shielding with the second soldering pads faces the adhesive surface of the carrier plate. The second shielding layer may be formed on the first shielding layer, the electronic devices that do not need shielding and the plastic encapsulation layer. Then the carrier plate may be peeled off to form the pre-packaging plate. The back surface of the pre-packaging plate may expose the first soldering pads and the second soldering pads. Then the first external contact structures connected to the first soldering pads and second external contact structures connected to the second soldering pads, may be formed on the back surface of the pre-packaging plate. By forming the second shielding layer on the first shielding layer, the second shielding layer may completely cover a surface of a portion of the first shielding layer on the non-functional surfaces and the sidewalls of the semiconductor chips, and on the side surfaces of the first plastic encapsulation layer. The second shielding layer may cover a portion of the first shielding layer with uneven thickness and poor edge coverage. The overall shielding layer formed by the first shielding layer and the second shielding layer may be complete. The shielding performance may be improved.

The second shielding layer may be only located on a portion of the first shielding layer on the non-functional surfaces and the sidewalls of the semiconductor chips, and may have an ellipsoidal surface for each semiconductor chip. The second shielding layer may be formed by a selective plating process, a dispersing process, or a mesh printing process. The second shielding layer may cover the first shielding layer to prevent forming of an area with poor coverage in the second shielding layer, further improve the integrity of the overall shielding layer formed by the first shielding layer and the second shielding layer. Subsequently, no extra mask or etching process may be necessary for removing the semiconductor chips.

The intermediate material layer may be formed on the non-functionals surfaces and the sidewalls of the semiconductor chips, and may have an ellipsoidal surface. The first shielding layer may be formed on the intermediate material layer, and may also have an ellipsoidal surface. By forming the intermediate material layer, the first shielding layer with different materials may be formed on the intermediate material layer by different processes, and the surface of the first shielding layer 103 may be ellipsoidal. Further, when forming the first shielding layer on the ellipsoidal surface of the intermediate material layer, the first shielding layer may not be affected by the sharp corners or steep sidewalls. Correspondingly, a problem that the second shielding layer has uneven thickness and poor edge coverage in the first shielding layer may be avoided. The integrity of the shielding layer may be improved.

The first shielding layer is a magnetic field shielding layer and the second shielding layer is an electric field shielding layer; or the first shielding layer is an electric field shielding layer and the second shielding layer is a magnetic field shielding layer. By forming the first shielding layer and the second shielding layer with the above structure, the first shielding layer and the second shielding layer may shield the electric field and the magnetic field respectively, and the shielding performance of the shielding layer may be improved. The second shielding layer may cover a portion of the first shielding layer with uneven thickness and poor edge coverage. The overall shielding layer formed by the first shielding layer and the second shielding layer may be complete. The shielding performance may be improved.

After forming the first and second external contact structures, the pre-packaging plate may be cut, to form discrete packaging structures. Massive fabrication of the packaging structure with the first shielding layer and the second shielding layer may be achieved, to improve fabrication efficiency.

The bottom shielding layer may be formed on the functional surfaces of the semiconductor chips. The bottom shielding layer may completely cover the functional surfaces of the semiconductor chips, and have surrounding edges flush with surrounding sidewalls of the semiconductor chips. The first soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

The semiconductor chips with the bottom shielding layer are formed by: providing a wafer; forming the semiconductor chips on the wafer, wherein each semiconductor chip includes a top dielectric layer and a top interconnection structure in the top dielectric layer; forming an isolation layer on the top dielectric layer of each semiconductor chips;

etching isolation layers to form first openings and third openings surrounding the first openings, wherein a remaining portion of the isolation layers are only located between the first openings and the third openings to separate the first openings from the third openings; filling the first openings with metal to form the first soldering pads; filling the third openings with metal to form the bottom shielding layer; forming a first soldering pad on each first soldering pad; forming the first encapsulation layer covering the first soldering pads and the bottom shielding layer; and cutting the wafer to form the discrete semiconductor chips with the bottom shielding layer. The bottom shielding layer may be formed and the process for forming the bottom shielding layer may be integrated into the existing process for the semiconductor chips. The process for forming the bottom shielding layer may be performed at a same time when forming the first soldering pads. The process may be simplified, and the process difficulty may be reduced, and the efficiency may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a packaging structure, comprising:
   providing semiconductor chips, wherein each semiconductor chip includes a functional surface, a non-functional surface opposite to the functional surface, first soldering pads on the functional surface;
   providing electronic devices that do not need shielding, and second soldering pads on surfaces of the electronic devices that do not need shielding;
   providing a carrier plate;
   adhering functional surfaces of the semiconductor chips to the carrier plate;
   forming a first shielding layer covering non-functional surfaces and sidewalls of the semiconductor chips;
   adhering each electronic device that does not need shielding to the carrier plate at a side of a corresponding semiconductor chip, wherein a surface of the electronic device that does not need shielding with the second soldering pads faces the adhesive surface of the carrier plate;
   forming a second shielding layer on the first shielding layer;
   forming a plastic encapsulation layer covering the second shielding layer, the electronic devices that do not need shielding, and the carrier plate;
   peeling off the carrier plate to form a pre-packaging plate, wherein a back surface of the pre-packaging plate exposes the first soldering pads on the functional surfaces of the semiconductor chips and the second soldering pads on the electronic devices that do not need shielding; and
   forming first external contact structures connected to the first soldering pads and second external contact structures connected to the second soldering pads, on the back surface of the pre-packaging plate.

2. The method according to claim 1, wherein:
   the first shielding layer is formed by a sputtering process and further covers at least a portion of the carrier plate between the semiconductor chips;
   the electronic devices that do not need shielding are adhered to the carrier plate before or after forming the first shielding layer; and
   a portion of the first shielding layer at sides of the semiconductor chips is removed after forming the second shielding layer or after peeling off the carrier plate.

3. The method according to claim 2, wherein:
   the second shielding layer only covers a portion of the first shielding layer on the non-functional surfaces and the sidewalls of the semiconductor chips;
   the second shielding layer has an ellipsoidal surface on each semiconductor chip; and
   the second shielding layer is formed by a selective plating process, a dispersing process, or a mesh printing process.

4. The method according to claim 3, wherein:
   the first shielding layer is made of copper, tungsten, aluminum, or a combination thereof; and
   the second shielding layer is made of copper, solder, conductive silver paste, or a combination thereof.

5. The method according to claim 1, wherein:
   the first shielding layer is a magnetic field shielding layer and the second shielding layer is an electric field shielding layer; or
   the first shielding layer is an electric field shielding layer and the second shielding layer is a magnetic field shielding layer.

6. The method according to claim 5, wherein:
   the electric field shielding layer is made of copper, tungsten, aluminum, or a combination thereof; and
   the magnetic field shielding layer is made of CoFeB, CoFeTa, NiFe, Co, CoFe, CoPt, Ni—Co—Fe alloy, or a combination thereof.

7. The method according to claim 1, wherein:
   a bottom shielding layer is disposed on the functional surfaces of the semiconductor chips to cover the whole functional surfaces of the semiconductor chips;
   surrounding edges of the bottom shielding layer are flush with surrounding sidewalls of the semiconductor chips;
   the first soldering pads penetrate through the bottom shielding layer and are isolated from the bottom shielding layer by isolation layers; and
   when forming the first shielding layer, the first shielding layer is connected to the surrounding edges of the bottom shielding layer.

8. The method according to claim 7, wherein the semiconductor chips with the bottom shielding layer are formed by:
   providing a wafer;
   forming the semiconductor chips on the wafer, wherein each semiconductor chip includes a top dielectric layer and a top interconnection structure in the top dielectric layer;
   forming an isolation layer on the top dielectric layer of each semiconductor chips;
   etching isolation layers to form first openings and third openings surrounding the first openings, wherein a remaining portion of the isolation layers are only located between the first openings and the third openings to separate the first openings from the third openings;
   filling the first openings with metal to form the first soldering pads;
   filling the third openings with metal to form the bottom shielding layer;
   forming a first soldering pad on each first soldering pad;
   forming the first encapsulation layer covering the first soldering pads and the bottom shielding layer; and cutting the wafer to form the discrete semiconductor chips with the bottom shielding layer.

9. The method according to claim 8, wherein:
the first soldering pads and the bottom shielding layer are formed by a same process including: forming a metal material layer in the first openings and the third openings, and on surfaces of the isolation layers; and planarizing the metal material layer to remove a portion of the metal material layer higher than the surfaces of the isolation layers, to form the first soldering pads in the first openings and the bottom shielding layer in the third openings.

10. The method according to claim 1 wherein:
each first external contact structure includes: a rewiring layer connected to a corresponding first soldering pad on the back surface of the pre-packaging plate; and external contact parts on the rewiring layer and connected to the rewiring layer.

11. The method according to claim 10, further including:
after peeling off the carrier plate, forming an insulating layer on the back surface of the pre-packaging plate;
forming the first openings in the insulating layer to expose the first soldering pads and second openings in the insulating layer to expose the second soldering pads;
forming a rewiring layer is formed in each first opening and a corresponding portion of a surface of the insulation layer and the external contact parts on a portion of the rewiring layer outside the first opening; and
forming a second external contact structure in each second opening.

12. The method according to claim 11, wherein:
each second external contact structure includes a soldering ball.

13. The method according to claim 11, further including:
forming conductive contact structures in the insulating layer to electrically connect the first shielding layer to a portion of the rewiring layers.

14. The method according to claim 1, further including:
after forming the external contact structures, cutting the pre-packaging plate to form discrete packaging structures.

15. The method according to claim 1, wherein:
the first shielding layer has an ellipsoidal surface on each semiconductor chip;
the first shielding layer is formed directly on the non-functional surfaces and the sidewalls of the semiconductor chips by a dispersing process or a mesh printing process; and
the second shielding layer is formed by a sputtering process, a selective plating process, a dispersing process, or a mesh printing process.

16. The method according to claim 15, wherein:
the first shielding layer is made of solder, conductive silver paste, or a combination thereof; and
the second shielding layer is made of copper, tungsten, aluminum, solder, conductive silver paste, or a combination thereof.

17. The method according to claim 15, before forming the first shielding layer, further including forming an intermediate material layer on the non-functional surfaces and the sidewalls of the semiconductor chips, wherein:
the intermediate material layer has an ellipsoidal surface on each semiconductor chip;
the first shielding layer is formed on the intermediate material layer; and
the first shielding layer has the ellipsoidal surface on each semiconductor chip.

* * * * *